(12) United States Patent
Hsiao et al.

(10) Patent No.: US 9,214,351 B2
(45) Date of Patent: Dec. 15, 2015

(54) MEMORY ARCHITECTURE OF THIN FILM 3D ARRAY

(71) Applicant: MACRONIX INTERNATIONAL CO., LTD., Hsinchu (TW)

(72) Inventors: Yi-Hsuan Hsiao, Hsinchu (TW); Hang-Ting Lue, Hsinchu (TW); Wei-Chen Chen, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 110 days.

(21) Appl. No.: 13/970,482

(22) Filed: Aug. 19, 2013

(65) Prior Publication Data

US 2014/0269078 A1    Sep. 18, 2014

Related U.S. Application Data

(60) Provisional application No. 61/778,377, filed on Mar. 12, 2013.

(51) Int. Cl.
*G11C 16/04* (2006.01)
*H01L 21/28* (2006.01)
(Continued)

(52) U.S. Cl.
CPC .... *H01L 21/28282* (2013.01); *H01L 27/11578* (2013.01); *H01L 29/7926* (2013.01); *G11C 16/0483* (2013.01); *G11C 16/10* (2013.01); *G11C 16/26* (2013.01); *G11C 16/3418* (2013.01)

(58) Field of Classification Search
CPC ........... G11C 16/0483; G11C 16/3418; G11C 16/10; G11C 16/26
USPC ............................ 365/185.17, 185.33, 230.05
See application file for complete search history.

(56) References Cited

U.S. PATENT DOCUMENTS 4,460,984 A   7/1984  Knepper
4,881,114 A   11/1989 Mohsen et al.
(Continued)

FOREIGN PATENT DOCUMENTS

CN    1759482 A    4/2006
CN    101350360 A  1/2009
(Continued)

OTHER PUBLICATIONS

Choi et al., "Performance Breakthrough in NOR Flash Memory with Dopant-Segregated Schottky-Barrier (DSSB) SONOS Device", 2009 Symposium onVLSI Technology Digest of Technical Papers, Jun. 16-18, 2009, pp. 1-2.
(Continued)

*Primary Examiner* — Jason Lappas
(74) *Attorney, Agent, or Firm* — Kenta Suzue; Haynes Beffel & Wolfeld LLP

(57) ABSTRACT

A 3D memory device includes an improved dual gate memory cell. The improved dual gate memory cell has a channel body with opposing first and second side surfaces, charge storage structures on the first and second side surfaces, and a gate structure overlying the charge storage structures on both the first and second side surfaces. The channel body has a depth between the first and second side surfaces less than a threshold channel body depth, combined with the gate structure which establishes an effective channel length of the cell greater than a threshold length. The combination of the channel body depth and effective channel length are related so that the cell channel body can be fully depleted, and sub-threshold leakage current can be suppressed when the memory cell has a high threshold state under a read bias.

8 Claims, 12 Drawing Sheets

(51) Int. Cl.
*H01L 29/792* (2006.01)
*H01L 27/115* (2006.01)
*G11C 16/34* (2006.01)
*G11C 16/10* (2006.01)
*G11C 16/26* (2006.01)

(56) References Cited

U.S. PATENT DOCUMENTS

| | | |
|---|---|---|
| 5,374,564 A | 12/1994 | Bruel |
| 5,389,566 A | 2/1995 | Lage |
| 5,599,724 A | 2/1997 | Yoshida |
| 5,751,012 A | 5/1998 | Wolstenholme et al. |
| 5,891,805 A | 4/1999 | Cheng et al. |
| 5,912,489 A | 6/1999 | Chen et al. |
| 5,991,193 A | 11/1999 | Gallagher et al. |
| 5,993,667 A | 11/1999 | Overman |
| 6,034,882 A | 3/2000 | Johnson et al. |
| 6,323,117 B1 | 11/2001 | Noguchi |
| 6,486,027 B1 | 11/2002 | Noble et al. |
| 6,507,061 B1 | 1/2003 | Hudgens et al. |
| 6,555,858 B1 | 4/2003 | Jones et al. |
| 6,570,795 B1 | 5/2003 | Fricke et al. |
| 6,579,760 B1 | 6/2003 | Lung |
| 6,593,624 B2 | 7/2003 | Walker |
| 6,646,912 B2 | 11/2003 | Hurst et al. |
| 6,653,712 B2 | 11/2003 | Knall et al. |
| 6,737,675 B2 | 5/2004 | Patel et al. |
| 6,770,939 B2 | 8/2004 | Subramanian et al. |
| 6,781,858 B2 | 8/2004 | Fricke et al. |
| 6,815,704 B1 | 11/2004 | Chen |
| 6,817,531 B2 | 11/2004 | Taussig et al. |
| 6,849,905 B2 | 2/2005 | Ilkbahar et al. |
| 6,858,899 B2 | 2/2005 | Mahajani et al. |
| 6,897,467 B2 | 5/2005 | Doan et al. |
| 6,906,361 B2 | 6/2005 | Zhang |
| 6,906,940 B1 | 6/2005 | Lue |
| 6,989,602 B1 | 1/2006 | Lytle |
| 7,005,350 B2 | 2/2006 | Walker et al. |
| 7,018,783 B2 | 3/2006 | Iwasaki et al. |
| 7,018,911 B2 | 3/2006 | Lee et al. |
| 7,020,012 B2 | 3/2006 | Rinerson et al. |
| 7,030,459 B2 | 4/2006 | Lai et al. |
| 7,081,377 B2 | 7/2006 | Cleeves |
| 7,115,967 B2 | 10/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,369,436 B2 | 5/2008 | Forbes |
| 7,382,647 B1 | 6/2008 | Gopalakrishnan |
| 7,394,089 B2 | 7/2008 | Doyle et al. |
| 7,420,242 B2 | 9/2008 | Lung |
| 7,459,715 B2 | 12/2008 | Toda et al. |
| 7,473,589 B2 | 1/2009 | Lai et al. |
| 7,485,891 B2 | 2/2009 | Hamann et al. |
| 7,504,653 B2 | 3/2009 | Lung |
| 7,560,337 B2 | 7/2009 | Ho et al. |
| 7,579,613 B2 | 8/2009 | Lung et al. |
| 7,606,059 B2 | 10/2009 | Toda |
| 7,623,370 B2 | 11/2009 | Toda et al. |
| 7,646,041 B2 | 1/2010 | Chae et al. |
| 7,663,900 B2 | 2/2010 | Stipe |
| 7,696,559 B2 | 4/2010 | Arai et al. |
| 7,709,334 B2 | 5/2010 | Lai et al. |
| 7,718,989 B2 | 5/2010 | Lai et al. |
| 7,763,878 B2 | 7/2010 | Horii et al. |
| 7,778,063 B2 | 8/2010 | Brubaker et al. |
| 7,796,437 B2 | 9/2010 | Cazzaniga |
| 7,851,849 B2 | 12/2010 | Kiyotoshi |
| 7,855,378 B2 | 12/2010 | Lin et al. |
| 7,855,457 B2 | 12/2010 | Mizukami et al. |
| 7,868,313 B2 | 1/2011 | Breitwisch et al. |
| 7,884,343 B2 | 2/2011 | Lung et al. |
| 7,884,417 B2 | 2/2011 | Mizukami et al. |
| 7,936,611 B2 | 5/2011 | Lee et al. |
| 7,948,024 B2 | 5/2011 | Kim et al. |
| 7,977,735 B2 | 7/2011 | Lai et al. |
| 7,983,065 B2 | 7/2011 | Samachisa |
| 7,995,371 B2 | 8/2011 | Rinerson et al. |
| 8,124,968 B2 | 2/2012 | Koo et al. |
| 8,134,139 B2 | 3/2012 | Lin et al. |
| 8,154,128 B2 | 4/2012 | Lung |
| 8,188,517 B2 | 5/2012 | Choi |
| 8,203,187 B2 | 6/2012 | Lung et al. |
| 8,208,279 B2 | 6/2012 | Lue |
| 8,236,623 B2 | 8/2012 | Schricker et al. |
| 8,279,656 B2 | 10/2012 | Chien et al. |
| 8,331,149 B2 | 12/2012 | Choi et al. |
| 8,363,476 B2 | 1/2013 | Lue et al. |
| 8,383,512 B2 | 2/2013 | Chen et al. |
| 8,426,294 B2 | 4/2013 | Lung et al. |
| 8,437,192 B2 | 5/2013 | Lung et al. |
| 8,467,219 B2 | 6/2013 | Lue |
| 8,486,791 B2 | 7/2013 | Lue |
| 8,503,213 B2 | 8/2013 | Chen et al. |
| 8,574,992 B2 | 11/2013 | Chen et al. |
| 8,587,998 B2 | 11/2013 | Hung |
| 8,630,114 B2 | 1/2014 | Lue |
| 8,659,944 B2 | 2/2014 | Hung et al. |
| 2001/0055838 A1 | 12/2001 | Walker et al. |
| 2002/0028541 A1 | 3/2002 | Lee et al. |
| 2002/0042158 A1 | 4/2002 | Kersch et al. |
| 2002/0071311 A1 | 6/2002 | Jeong et al. |
| 2002/0114188 A1 | 8/2002 | Lee |
| 2003/0003647 A1 | 1/2003 | Dennison et al. |
| 2003/0215978 A1 | 11/2003 | Maimon et al. |
| 2004/0023499 A1 | 2/2004 | Hellig et al. |
| 2004/0026686 A1 | 2/2004 | Lung |
| 2004/0114317 A1 | 6/2004 | Chiang et al. |
| 2004/0119122 A1 | 6/2004 | Ilkbahar et al. |
| 2004/0124466 A1 | 7/2004 | Walker et al. |
| 2004/0165443 A1 | 8/2004 | Harari |
| 2004/0188714 A1 | 9/2004 | Scheuerlein et al. |
| 2004/0240268 A1 | 12/2004 | Kim et al. |
| 2005/0019975 A1 | 1/2005 | Lee et al. |
| 2005/0127347 A1 | 6/2005 | Choi et al. |
| 2005/0133860 A1 | 6/2005 | Forbes |
| 2005/0230724 A1 | 10/2005 | Hsu |
| 2005/0280061 A1 | 12/2005 | Lee |
| 2006/0001174 A1 | 1/2006 | Matsui |
| 2006/0003263 A1 | 1/2006 | Chang |
| 2006/0077741 A1 | 4/2006 | Wang et al. |
| 2006/0091556 A1 | 5/2006 | Shigeoka |
| 2006/0110878 A1 | 5/2006 | Lung et al. |
| 2006/0146608 A1 | 7/2006 | Fasoli et al. |
| 2006/0175596 A1 | 8/2006 | Happ et al. |
| 2007/0045605 A1 | 3/2007 | Hsueh |
| 2007/0045606 A1 | 3/2007 | Magistretti et al. |
| 2007/0045708 A1 | 3/2007 | Lung |
| 2007/0090434 A1 | 4/2007 | Davies et al. |
| 2007/0132049 A1 | 6/2007 | Stipe |
| 2007/0134855 A1 | 6/2007 | Lai et al. |
| 2007/0140001 A1 | 6/2007 | Motoi et al. |
| 2007/0148973 A1 | 6/2007 | Higashitani et al. |
| 2007/0158736 A1 | 7/2007 | Arai et al. |
| 2007/0231750 A1 | 10/2007 | Parikh |
| 2007/0235710 A1 | 10/2007 | Matsuzaki et al. |
| 2007/0246782 A1 | 10/2007 | Philipp et al. |
| 2007/0252201 A1 | 11/2007 | Kito et al. |
| 2007/0253233 A1 | 11/2007 | Mueller et al. |
| 2008/0037349 A1 | 2/2008 | Stipe |
| 2008/0048237 A1 | 2/2008 | Iwata |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0106931 A1 | 5/2008 | Toda |
| 2008/0116441 A1 | 5/2008 | Raghuram et al. |
| 2008/0128853 A1 | 6/2008 | Choi et al. |
| 2008/0149913 A1 | 6/2008 | Tanaka et al. |
| 2008/0157053 A1 | 7/2008 | Lai et al. |
| 2008/0170429 A1 | 7/2008 | Bertin et al. |
| 2008/0175032 A1 | 7/2008 | Tanaka et al. |
| 2008/0180994 A1 | 7/2008 | Katsumata et al. |
| 2008/0239818 A1 | 10/2008 | Mokhlesi et al. |

(56) References Cited

U.S. PATENT DOCUMENTS

| | | |
|---|---|---|
| 2008/0242034 A1 | 10/2008 | Mokhlesi et al. |
| 2008/0247230 A1 | 10/2008 | Lee et al. |
| 2008/0265235 A1 | 10/2008 | Kamigaichi et al. |
| 2008/0285350 A1 | 11/2008 | Yeh |
| 2009/0020744 A1 | 1/2009 | Mizukami et al. |
| 2009/0097309 A1 | 4/2009 | Mizukami et al. |
| 2009/0097321 A1 | 4/2009 | Kim et al. |
| 2009/0117707 A1 | 5/2009 | Shimomura et al. |
| 2009/0148980 A1 | 6/2009 | Yu |
| 2009/0184360 A1 | 7/2009 | Jin et al. |
| 2009/0225588 A1 | 9/2009 | Czubatyj et al. |
| 2009/0230449 A1 | 9/2009 | Sakaguchi et al. |
| 2009/0278193 A1 | 11/2009 | Murata et al. |
| 2009/0298223 A1 | 12/2009 | Cheek et al. |
| 2009/0310425 A1 | 12/2009 | Sim et al. |
| 2010/0013049 A1 | 1/2010 | Tanaka et al. |
| 2010/0020617 A1 | 1/2010 | Oh et al. |
| 2010/0054015 A1 | 3/2010 | Lee et al. |
| 2010/0059808 A1 | 3/2010 | Zheng et al. |
| 2010/0120226 A1 | 5/2010 | Yamazaki et al. |
| 2010/0184295 A1 | 7/2010 | Sato et al. |
| 2010/0193763 A1 | 8/2010 | Chen et al. |
| 2010/0226195 A1 | 9/2010 | Lue |
| 2010/0237312 A1 | 9/2010 | Seol et al. |
| 2010/0259961 A1 | 10/2010 | Fasoli et al. |
| 2010/0265773 A1 | 10/2010 | Lung et al. |
| 2010/0270593 A1 | 10/2010 | Lung et al. |
| 2010/0291747 A1 | 11/2010 | Lung et al. |
| 2010/0315875 A1 | 12/2010 | Kim et al. |
| 2010/0322000 A1 | 12/2010 | Shim et al. |
| 2011/0031630 A1 | 2/2011 | Hashimoto |
| 2011/0034003 A1 | 2/2011 | Lung |
| 2011/0069524 A1 | 3/2011 | Toba et al. |
| 2011/0085370 A1 | 4/2011 | Chen et al. |
| 2011/0127483 A1 | 6/2011 | Sonehara |
| 2011/0140070 A1 | 6/2011 | Kim |
| 2011/0180775 A1 | 7/2011 | Lin et al. |
| 2011/0216604 A1 | 9/2011 | Mikajiri et al. |
| 2011/0227026 A1 | 9/2011 | Sekar et al. |
| 2011/0235421 A1 | 9/2011 | Itagaki et al. |
| 2011/0241077 A1 | 10/2011 | Lung |
| 2011/0284946 A1 | 11/2011 | Kiyotoshi |
| 2011/0286283 A1 | 11/2011 | Lung et al. |
| 2011/0292738 A1 | 12/2011 | Hsu et al. |
| 2012/0002477 A1 | 1/2012 | Tang et al. |
| 2012/0007167 A1 | 1/2012 | Hung et al. |
| 2012/0051136 A1 | 3/2012 | Kang et al. |
| 2012/0051137 A1 | 3/2012 | Hung et al. |
| 2012/0068241 A1 | 3/2012 | Sakuma et al. |
| 2012/0112260 A1 | 5/2012 | Kim et al. |
| 2012/0119283 A1 | 5/2012 | Lee et al. |
| 2012/0147689 A1 | 6/2012 | Scheuerlein et al. |
| 2012/0151137 A1 | 6/2012 | Hsu |
| 2012/0182804 A1 | 7/2012 | Hung et al. |
| 2012/0182806 A1 | 7/2012 | Chen et al. |
| 2012/0182808 A1 | 7/2012 | Lue et al. |
| 2012/0184097 A1 | 7/2012 | Chen et al. |
| 2012/0188813 A1 | 7/2012 | Chien et al. |
| 2012/0236642 A1 | 9/2012 | Lue |
| 2012/0281471 A1 | 11/2012 | Hung et al. |
| 2012/0327714 A1 | 12/2012 | Lue |
| 2013/0003434 A1* | 1/2013 | Lue et al. .................. 365/51 |
| 2013/0082341 A1 | 4/2013 | Shimizu et al. |
| 2013/0182487 A1 | 7/2013 | Lee et al. |
| 2013/0242667 A1 | 9/2013 | Shim et al. |
| 2013/0277799 A1 | 10/2013 | Chen et al. |
| 2013/0277852 A1 | 10/2013 | Chen |
| 2013/0341797 A1 | 12/2013 | Lim |

FOREIGN PATENT DOCUMENTS

| | | |
|---|---|---|
| CN | 101477987 A | 7/2009 |
| EP | 1936681 A1 | 6/2008 |
| EP | 2048709 A2 | 4/2009 |
| TW | 201123266 A | 7/2011 |

OTHER PUBLICATIONS

Choi, et al. "Investigation of Gate-Induced Drain Leakage (GIDL) Current in Thin Body Devices: Single-Gate Ultra-Thin Body, Symmetrical Double-Gate, and Assymmetrical Double-Gate MOSFETs," Jpn. J. Appl. Phys. vol. 42, Apr. 2003, pp. 2073-2076.

Farhi, G., et al., "Study of the solid phase crystallization behavior of amorphous sputtered silicon by X-ray diffraction and electrical measurements", (2002), Solar Energy Materials & Solar Cells 72:551-558; 8 pgs.

Fukuzumi et al. "Optimal Integration and Characteristics of Vertical Array Devices for Ultra-High Density, Bit-Cost Scalable Flash Memory," IEEE Dec. 2007, pp. 449-452.

Goebel, B., et al., "Fully Depleted Surrounding Gate Transistor (SGT) for 70 nm DRAM and Beyond," IEEE IEDM 2002, 10.8.1-10.8.4.

Hsu et al., "Study of Sub-30nm Thin Film Transistor (TFT) Charge-Trapping (CT) Devices for 3D NAND Flash Application," 2009 IEEE, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, pp. 27.6.1-27.6.4.

Ishiduki M. et al., "Optimal Device Structure for Pipe-shaped BiCS Flash Memory for Ultra High Density Storage Device with Excellent Performance and Reliability," Electron Devices Meeting (IEDM), 2009 IEEE Int'l, Baltimore MD, pp. 27.3.1-27.3.4.

Jang et al., "Vertical Cell Array using TCAT(Terabit Cell Array Transistor) Technology for Ultra High Density NAND Flash Memory", 2009 Symposium on VLSI Technology Digest of Technical Papers, p. 192-193.

Jeong, Min-Kyu, et al., "Gate Work Function and Contact Engineering in Nanoscale Vertical Pillar Transistor for DRAM Cell Transistors," Kyoto, Japan, Nov. 5-8, 2007, pp. 112-113.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Sructure for Beyond 30nm Node," IEEE IEDM, Dec. 11-13, 2006, 4 pages.

Katsumata et al., "Pipe-shaped BiCS Flash Memory With 16 Stacked Layers and Multi-Level-Cell Operation for Ultra High Density StorageDevices," 2009 Symposium on VLSI Technology Digest of Technical Papers, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage", 2009 Symposium on VLSI Technology Digest of Technical Papers, p. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, pp. 122-123.

Lai et al., "A Multi-Layer Stackable Thin-Film Transistor (TFT) Nand-Type Flash Memory", IEEE Int'l Electron Devices Meeting, Dec. 11-13, 2006.

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.

(56) References Cited

OTHER PUBLICATIONS

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Maeda, S, et al. "A Vertical F-Shape Transistor (VFT) Cell for 1Gbit DRAM and Beyond," 1994 Symposium on VLSI Technology, Digest of Technical Papers. Jun. 7-9, 1994 pp. 133-134.

Paul et al., "Impact of a Process Variation on Nanowire and Nanotube Device Performance", IEEE Transactions on Electron Devices, vol. 54, No. 9, Sep. 2007, p. 2369-2376.

Risch, Lothar, et al., "Recent Progress with Vertical Transistors," Solid-State Device Research Conference, 1997. Proceeding of the 27th European Sep. 22-24, 1997 pp. 34-41.

Sakamoto W., et al., "Reliability Improvement in Planar MONOS Cell for 20nm-node Multi-Level NAND Flash Memory and beyond," Tech. Digest of Intl Electron Devices Meeting 2009, pp. 34.4.1-34.4.4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 13/675,923, filed Nov. 13, 2012, 22 pages.

Hsiao, Yi-Hsuan et al., "Modeling the Variability Caused by Random Grain Boundary and Trap-location Induced Asymmetrical Read Behaviour for a Tight-pitch Vertical Gate 3D NAND Flash Memory Using Double-Gate Thin-Film Transistor (TFT) Device," Dec. 10-12, 2012, 3 pages.

Hsiao, Yi-Hsuan, et al., "A Critical Examination of 3D Stackable NAND Flash Memory Architectures by Simulation Study of the Scaling Capability," May 16-19, 2010, 5 pages.

Hung, et al., "Design Innovations to Optiimize the 3D Stackable Vertical Gate (VG) NAND Flash," Dec. 10-12, 2013, 3 pages.

Lue, Hang-Ting et al., "Current Development Status and Future Challenges of Charge-Trapping NAND Flash," Sep. 22-24, 2010, 2 pages.

Lue, Hang-Ting et al., "Overview of 3D NAND Flash and Progress of Vertical GAte (VG) Architecture," IEEE 11th Int'l Conf on Solid State and Integrated Circuit Technology (ICSICT), Oct. 29-Nov. 1, 2012, 4 pages.

\* cited by examiner

MEMORY ARCHITECTURE OF THIN FILM 3D ARRAY

RELATED APPLICATIONS

This application claims benefit of U.S. Provisional Patent Application No. 61/778,377 filed on 12 Mar. 2013, which application is incorporated by reference as if fully set forth herein.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

It is desirable to provide a structure for three-dimensional integrated circuit memory with a low manufacturing cost, including reliable, very small memory elements and improved process window associated with neighboring stacks of memory cell strings having gate structures.

SUMMARY OF THE INVENTION

A 3D memory device includes an improved dual gate memory cell. The improved dual gate memory cell has a channel body with opposing first and second side surfaces, charge storage structures on the first and second side surfaces, and a gate structure overlying the charge storage structures on both the first and second side surfaces. The channel body of the improved dual gate memory cell has a depth between the first and second side surfaces, such as less than 30 nanometers, combined with a gate structure which establishes an effective channel length of the cell greater than a threshold length, such as greater than two-thirds the channel body depth, or in some embodiments greater than 20 nanometers.

The dual gate memory cell in a high density 3D embodiment includes memory elements that include dielectric charge trapping structures that include a tunneling layer, a dielectric charge trapping layer, and a blocking layer. In 3D embodiments, the channel body is part of a semiconductor strip in a stack of strips, where the thickness of the strips defines a width of the channel in a plane parallel to the side surfaces.

The channel body depth in a 3D vertical gate "3DVG" structure described herein corresponds to the width of a stack of semiconductor bit line strips configured to act as the channels in strings of memory cells on respective levels of the stack. Wider bit line strips cause wider threshold voltage $V_T$ and wider subthreshold shift SS distributions as illustrated in FIGS. 12 and 13. These wider distributions become unacceptable for reliable operation for 3D products of reasonable density, when the bit line strip depths exceed 30 nanometers.

Furthermore, practical limitations on the width of the stacks arise from the difficulty of manufacturing stacks of semiconductors strips with high aspect ratios. For example, a 3DVG structure with an 8 layer stack with semiconductor strips having a thickness of 30 nanometers separated by 30 nanometer thick insulation layers, will have a total stack height of 240 nm. If the width of the stacks is 10 nanometers, then the aspect ratio is 24 (240/10 nm). Aspect ratios on the order of 24 or lower will be a challenge for process integration. Thus, it is considered important that the stacks of bit line strips have widths, at least at the lowest semiconductor strip in the stack, of more than 10 nanometers.

Also, the effective channel length of the 3DVG structure, and of other memory structures, must be long enough that the gate can control the channel effectively. For double gate MOSFET-like memory cells, the scaling limitation for short channel effect establishes a critical limitation for the effective channel length that is a function of the equivalent oxide thickness EOT of the charge storage structure of the memory cell and the channel body depth (i.e. width of the bit line strips in a 3DVG structure). Thus, it is important that the word line structures that provide the vertical gates for the memory cells have a width that is greater than the EOT of the charge storage structure, and greater than two-thirds the channel body depth.

The combination of the channel body depth and effective channel length are related, so that the cell channel body can be fully depleted, and sub-threshold leakage current can be suppressed when the memory cell has a high threshold state under a read bias operation.

Other aspects and advantages of the present invention can be seen on review of the drawings, the detailed description and the claims, which follow.

DETAILED DESCRIPTION

A detailed description of embodiments is provided with reference to the Figures.

Figure 1:
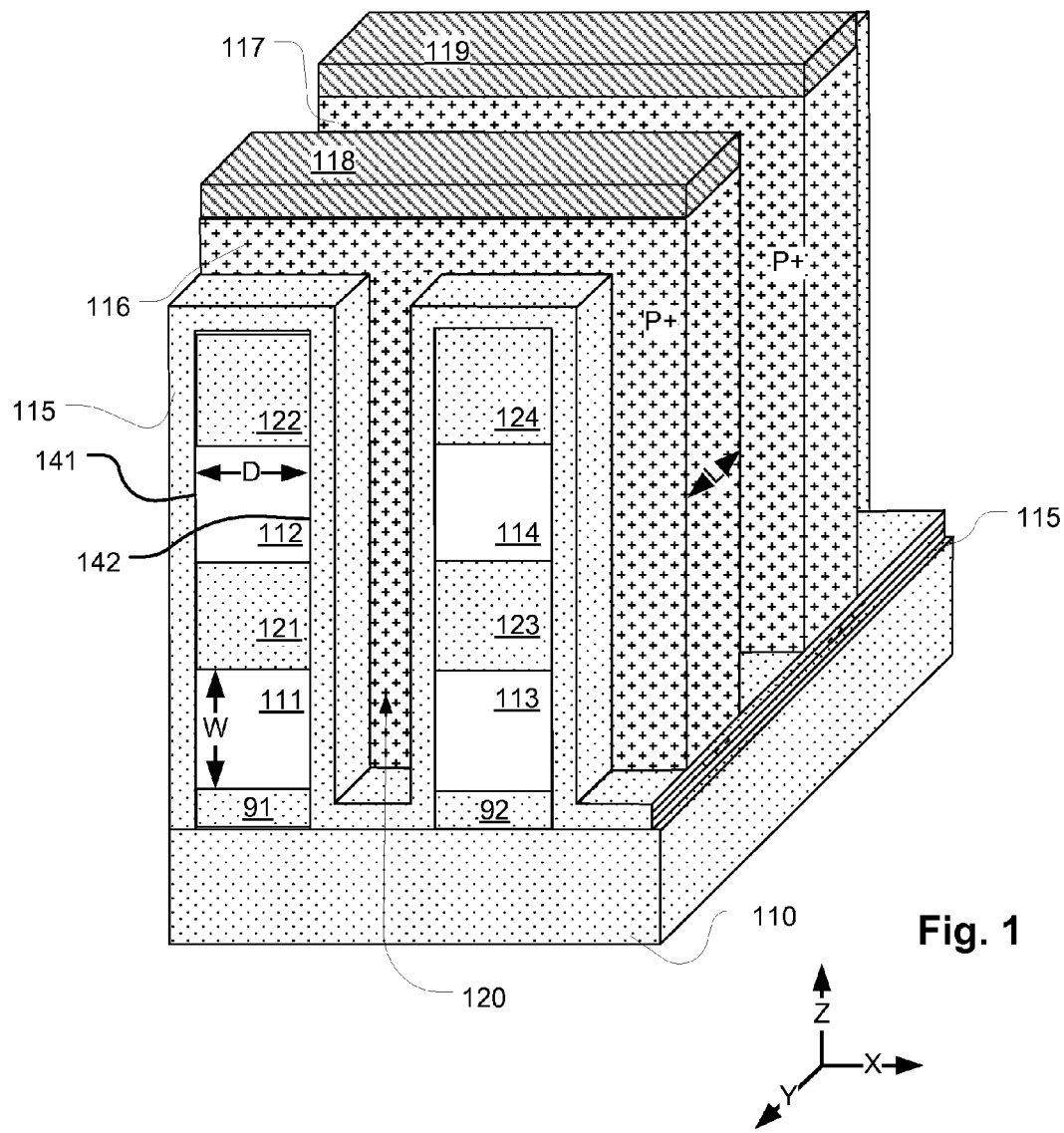
FIG. 1 is a perspective illustration of a 3D NAND-flash memory structure as described herein including a plurality of planes of semiconductor bit line strips parallel to a Y-axis, arranged in a plurality of ridge-shaped stacks, a charge trapping memory layer on side surfaces of the semiconductor bit line strips, and a plurality of word lines with conformal bottom surfaces arranged over the plurality of ridge-shaped stacks.

FIG. 1 is a perspective drawing of a 2×2 portion of a 3DVG three-dimensional charge trapping memory array with fill material removed from the drawing to give a view of the stacks of semiconductor bit line strips and orthogonal word lines that make up the 3D array. In this illustration, only two memory planes are shown. However, the number of planes can be extended to very large numbers. As shown in FIG. 1, the memory array is formed on an integrated circuit substrate having an insulating layer 110 over underlying semiconductor or other structures (not shown). The memory array includes a plurality of stacks (two are shown in the drawing) of semiconductor bit line strips 111, 112, 113, 114 separated by insulating material 91, 92, 121, 122, 123, and 124. The stacks are ridge-shaped extending on the Y-axis as illustrated in the figure, so that the semiconductor bit line strips 111-114 can be configured as channel bodies of strings of dual gate memory cells. Semiconductor bit line strips 111 and 113 can act as channel bodies in a first memory plane. Semiconductor bit line strips 112 and 114 can act as channel bodies in a second memory plane. The semiconductor bit line strips have opposing first and second side surfaces.

The insulating material 121 between the semiconductor bit line strips 111 and 112 in a first stack and the insulating material 123 between semiconductor bit line strips 113 and 114 in the second stack can have an equivalent oxide thickness of about 40 nm or less, where equivalent oxide thickness EOT is a thickness of the insulating material normalized according to a ratio of the dielectric constant of silicon dioxide and the dielectric constant of the chosen insulation material. The term "about 40 nm" is used here to account for variations on the order of 10% or so, as arise typically in manufacturing structures of this type. The thickness of the insulating material can play a critical role in reducing interference between cells in adjacent layers of the structure.

A layer 115 of memory material, such as dielectric charge storage structures, coats the plurality of stacks of semiconductor bit line strips in this example. A plurality of word lines including word lines 116 and 117 is arranged orthogonally over the plurality of stacks of semiconductor bit line strips. The word lines 116 and 117 have surfaces conformal with the plurality of stacks of semiconductor bit line strips, filling the trenches (e.g. 120) defined by the plurality of stacks, and establishing a multi-layer 3D array of interface regions at cross-points between the first and second side surfaces of the semiconductor bit line strips 111-114 in the plurality of stacks and the plurality of word lines including word lines 116 and 117. A layer of silicide (e.g. tungsten silicide, cobalt silicide, titanium silicide) 118, 119 can be formed over the top surfaces of the plurality of word lines including word lines 116, 117.

The charge storage structures disposed in the interface regions establish a 3D array of memory cells accessible via the plurality of semiconductor bit line strips and the plurality of word lines. The memory cells are arranged in strings between bit line structures and source line structures, as described in connection with FIG. 5. The charge storage structures comprise memory elements that can include dielectric charge trapping structures comprising a tunneling layer which can be formed of silicon oxide (O) about 1 to 4 nanometers thick, a dielectric charge trapping layer which can be formed of silicon nitride (N) about 5 to 8 nanometers thick (EOT of about 9.5 to 15.2), and a blocking layer which can be formed of silicon oxide (O) about 5 to 8 nanometers thick. The plurality of word lines can comprise polysilicon (S). The combined EOT for the charge storage structure can be about 16.5 to 27.2 in this example. The layer 115 of memory material can comprise other charge storage structures.

For example, a band gap engineered SONOS (BE-SONOS) charge storage structure can be used which includes a tunneling layer that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 115 in this embodiment comprises silicon dioxide on the side surface of the semiconductor bit line strips formed for example using in-situ steam generation ISSG with optional nitridation by either a post deposition NO anneal or by addition of NO to the ambient during deposition. The thickness of the first layer of silicon dioxide is less than 2 nanometers, and preferably 1.5 nanometers or less. Representative embodiments can be 1 nanometer or 1.2 nanometers thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 3 nanometers, and preferably 2.5 nanometers or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 3.5 nanometers, and preferably 2.5 nanometers or less. This three-layer tunneling layer results in an inverted U-shaped valence band energy level.

The valence band energy level at a first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells. The EOT of a band gap engineered tunneling layer can be about 7 to 10 nanometers for example, making the EOT of a charge storage structure incorporating the band gap engineered tunneling layer fall in a range of about 21.5 to 33.2 nanometers in this example. Use of high-k dielectrics in the blocking layer or in other layers of the charge storage structure can result in even higher EOT values for the charge storage structures.

A charge trapping layer in the layer 115 of memory material in this embodiment comprises silicon nitride having a thickness greater than 5 nanometers, including for example about 7 nanometers in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles, and so on.

The blocking dielectric layer in the layer 115 of memory material in this embodiment comprises a layer of silicon dioxide having a thickness greater than 5 nanometers, including for example about 9 nanometers in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide and multi-layer blocking structures.

In another representative embodiment, the hole tunneling layer can be 1.3 nanometers of silicon dioxide; the band offset layer can be 2 nanometers of silicon nitride; the isolation layer can be 2.5 nanometers of silicon dioxide; the charge trapping layer can be 7 nanometers of silicon nitride; and the blocking dielectric layer can be silicon oxide 9 nanometers thick. The gate material can be p+ polysilicon (work function about 5.1 eV) used in the word lines 116, 117. Also, the gate material can be metal.

The channels of the dual gate memory cells in the structure of FIG. 1 are formed in the strips 111, 112, 113, 114 in channel body regions with dimensions discussed herein. The channel body regions have a channel body width W determined essentially by the thickness in the Z dimension of the strips (e.g. as labeled on strip 111). The channel body regions have a length L in the current flow dimension, determined essentially by the width in the Y direction of the word line structure (e.g. as labeled on word line 116) where it crosses the corresponding strip. The channel body regions have a channel body depth D determined by the width in the X dimension of the strip (e.g. as labeled on strip 112). The channel depth of a dual gate memory cell is a dynamic variable that depends on cell threshold, gate voltage, current magnitude and other features like doping concentrations. In a dual gate memory cells, in which the gate voltage is the same on both sides, the channel having the channel body width and length, grows inwardly from the opposing side surfaces as the cell bias exceeds threshold conditions, and current flows. When the dual gate cell is off, with gate voltages below threshold, a depletion region having the channel body width and length forms also, extending inwardly from the opposing side surfaces.

The semiconductor bit line strips (e.g. 112) have channel depths D between the first and second side surfaces (e.g. 141 and 142) so that channel body thicknesses of the memory cells are less than a threshold thickness for fully depleted operation where the depletion regions extending from the opposing sides merge when the corresponding memory cell has a high threshold state or a programmed state under a read bias operation. Memory cells having channel body thicknesses at the threshold thickness can transition partially depleted operation to fully depleted operation at operating voltages used for three dimensional memory arrays of dual gate memory cells. Simulation results for the threshold channel body thickness are described in connection with FIGS. 16-19.

The semiconductor bit line strips 111-114 can be instrinsic semiconductor material. The word lines 116, 117 can be a semiconductor material with a conductivity type (e.g. p+-type). For example, the semiconductor bit line strips 111-114 can be made using intrinsic of lightly doped polysilicon or single crystal silicon, while the word lines 116, 117 can be made using relatively heavily doped p+-type polysilicon.

Figure 2:
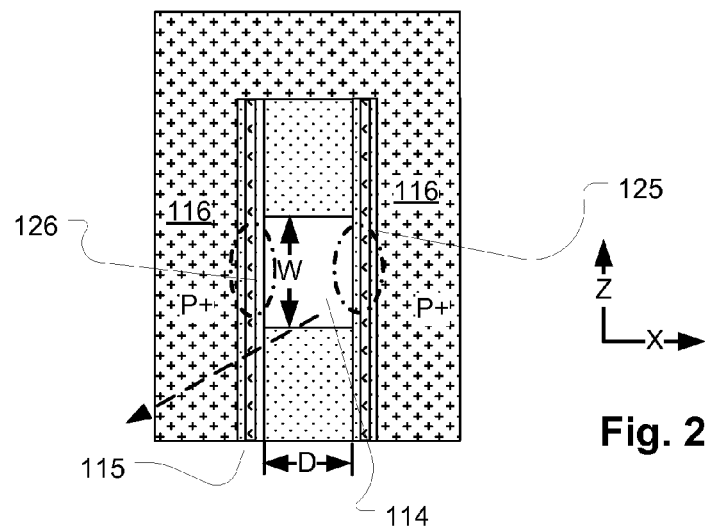
FIG. 2 is a cross-section of a memory cell taken in the X-Z plane from the structure of FIG. 1.

FIG. 2 shows a cross-sectional view taken in the X-Z plane of the charge trapping memory cell formed at the intersection of word line 116 and semiconductor strip 114. Active charge trapping regions 125, 126 are formed on both side surfaces of the strip 114 between the word lines 116 and the strip 114. In the embodiment described here, as shown in FIG. 2, each memory cell is a double gate field effect transistor having active charge storage regions 125, 126, one on each side of the semiconductor strip 114. The strip 114 has a channel body depth D, and a channel body width W. Electron current as illustrated by the dotted arrow in the diagram flows along the p-type semiconductor bit line strips, to sense amplifiers where it can be measured to indicate the state of a selected memory cell.

Figure 3:
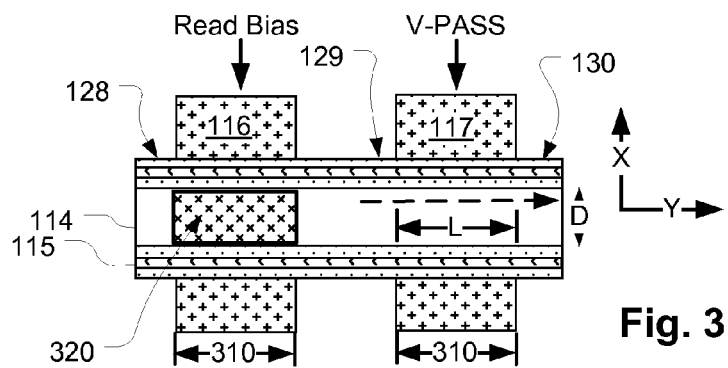
FIG. 3 is a cross-section of a memory cell taken in the X-Y plane from the structure of FIG. 1.

FIG. 3 shows a cross-sectional view taken in the X-Y plane of the charge trapping memory cells formed at the intersection of the word lines 116, 117 and the semiconductor strip 114. The current path down the semiconductor strip 114 is illustrated. The source/drain regions 128, 129, 130 between the word lines 116, 117 can be "junction-free," without source and drain doping, having a conductivity type opposite that of the channel regions beneath the word lines. In the junction-free embodiment, the charge trapping field effect transistors can have a p-type channel structure. Also, source and drain doping could be implemented in some embodiments, in a self-aligned implant after word line definition.

The word lines 116 and 117 have widths 310 along the first and second side surfaces of the semiconductor material strip 114. Memory cells are formed at interface regions at cross-points between the first and second side surfaces of the semiconductor material strip 114 and the plurality word lines 116 and 117. In operation, when voltage is applied to a gate structure of a memory element via one of the word lines, a channel region in a memory cell corresponding to the memory element beneath the gate structure is turned on, along the first and second side surfaces. Thus, the widths 310 of the word lines correspond to effective channel lengths L in the channel body regions of the memory cells.

Figure 4:
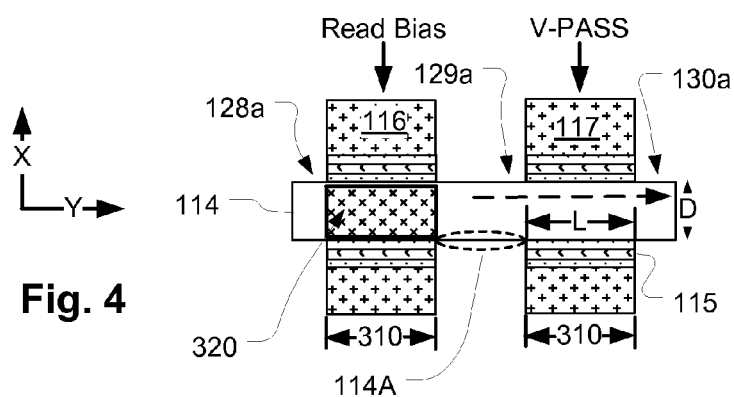
FIG. 4 is a cross-section of a memory cell taken in the X-Y plane from the structure of FIG. 1 with an alternative feature.

FIG. 4 is a cross-sectional view of a memory cell taken in the X-Y plane like that of FIG. 3. FIG. 4 differs from FIG. 3 in that the regions 128a, 129a and 130a along the side surfaces (e.g. 114A) of the semiconductor strip 114 may have the memory material removed.

In a nonvolatile memory chip, such as a NAND flash memory, a word line pass voltage V-PASS can be used to pass unselected cells, when a selected cell is programmed or read. An example selected cell can be the charge trapping memory cell formed at the intersection of word line 116 and semiconductor strip 114 as illustrated in FIG. 2. Active charge trapping regions 125, 126 are formed on the both side surfaces of the strip 114 between the word lines 116 and the strip 114.

In read operations, the word line pass voltage V-PASS is applied to unselected word lines (e.g. 117, FIG. 3) in a NAND string, and a read bias is applied to a selected word line (e.g. 116, FIG. 3) in the NAND string. Programmed memory cells can have at least a high threshold state and a low threshold state. Typically, the word line pass voltage V-PASS needs to be higher than both high and low threshold states of memory cells in the NAND string to make unselected cells in a NAND string act as pass transistors.

The read bias applied to the selected cell is such that the channel body is fully depleted if the selected cell has a high threshold state, relative to the read bias, and is conducting if the cell has a low threshold state. For instance, the channel body at cross-points of semiconductor strip 114 and word line 116 has a high threshold state and is fully depleted as indicated by a depletion region 320, while the channel body at cross-points of semiconductor strip 114 and word line 117 has a low threshold state and is conducting as indicated by the dotted arrow.

The word lines 116 and 117 have widths 310 along the first and second side surfaces of the semiconductor material strip 114 so that effective channel lengths L in the channel body regions of the memory cells are greater than a threshold length to suppress sub-threshold leakage current when the corresponding memory cell has a high threshold state under a read bias. Simulation results for the threshold effective channel lengths L are described in connection with FIGS. 12-15 and 20A-20D.

The sub-threshold leakage current is the current that flows between the source and drain of a MOSFET (metal-oxide-semiconductor-field-effect-transistor) when the transistor is in sub-threshold region, or when the gate-to-source voltages are below the threshold voltage ($V_T$) of the transistor and ideally there would be no current flowing between the source and drain. The sub-threshold leakage current is relatively small. However, as transistors are continually scaled down and the power supply is continually scaled down, proportion of the sub-threshold leakage current increases as compared to total power consumption. Suppression of sub-threshold leakage current can reduce dynamic power consumption of memory cells, and help improve reliability of memory cells.

Figure 5:
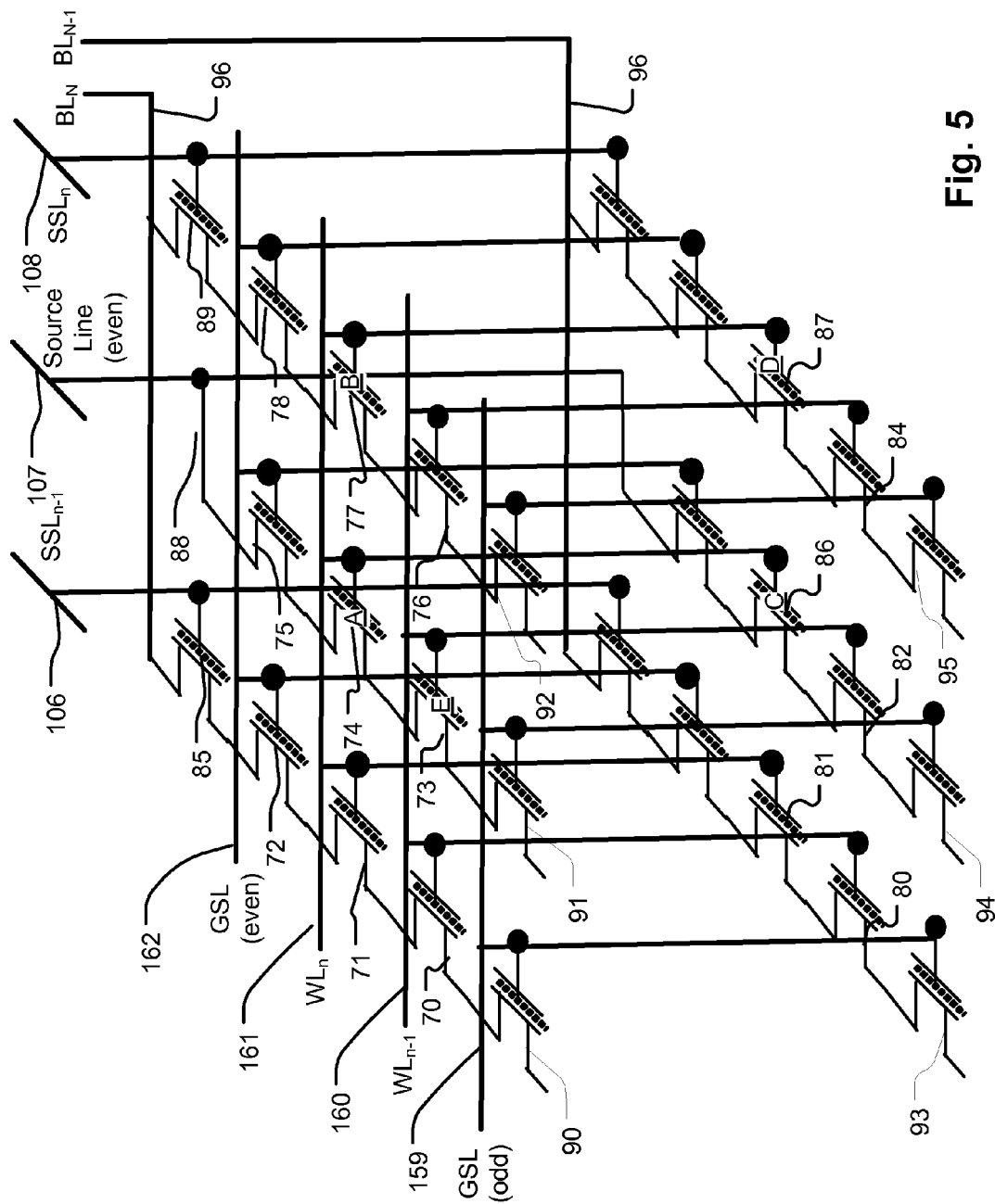
FIG. 5 is a schematic diagram of NAND flash memory having the structure of FIG. 1.

FIG. 5 is a schematic diagram showing 2 planes of memory cells having 6 charge trapping cells per plane arranged in a NAND configuration, which is representative of a cube which can include many planes and many word lines. The 2 planes of memory cells are defined at the cross-points of word lines 160, 161 acting as word lines WLn−1, WLn, with a first stack of semiconductor bit line strips, a second stack of semiconductor bit line strips and a third stack of semiconductor bit line strips.

The first plane of memory cells includes memory cells 70, 71 in a NAND string on a semiconductor strip, memory cells 73, 74 in a NAND string on a semiconductor strip, and memory cells 76, 77 in a NAND string on a semiconductor strip. Each NAND string is connected to a ground select transistor on either side (e.g., ground select devices 90, 72 on either side of the NAND string including memory cells 70, 71).

The second plane of memory cells corresponds with a bottom plane in the cube in this example, and includes memory cells (e.g. 80, 82, 84, 81, 86, 87) arranged in NAND strings in a similar manner to those in the first plane.

As shown in the figure, the word line 161 acting as word line WLn includes vertical extensions which correspond with the material in the trench 120 shown in FIG. 1 between the stacks, in order to couple the word line 161 to the memory cells (cells 71, 74, 77 in the first plane) in the interface regions in the trenches between the semiconductor bit line strips in all of the planes.

The memory array includes bit line structures including bit lines, and source line structures including source lines. Memory cells are arranged in strings between the bit line structures and source line structures. Memory cell strings in adjacent stacks alternate between a bit line end-to-source line end orientation and a source line end-to-bit line end orientation.

Bit lines $BL_N$ and $BL_{N-1}$ in the bit line structures terminate the memory cell strings, adjacent to the string select devices. For example, in the top memory plane, bit line $BL_N$ terminates the memory cell strings which have string select transistors 85 and 89. By contrast, the bit line is not connected to trace 88, because the strings of adjacent stacks alternate between a bit line end-to-source line end orientation and a source line end-to-bit line end orientation. So instead for this string, the corresponding bit line is connected to the other end of the string. In the bottom memory plane, bit line $BL_{N-1}$ terminates the memory cell strings which have corresponding string select transistors.

String select transistors 85, 89 are connected between respective NAND strings and string select lines $SSL_{n-1}$ and $SSL_n$ in this arrangement. Likewise, similar string select transistors on a bottom plane in the cube are connected between respective NAND strings and string select lines $SSL_{n-1}$ and $SSL_n$ in this arrangement. String select lines 106, 108, are connected to different ridges, to the gates of string select transistors in each memory cell string, and provide in this example string select signal $SSL_{n-1}$, $SSL_n$ and $SSL_{n+1}$.

By contrast, a string select transistor is not connected to trace 88, because the strings of adjacent stacks alternate between a bit line end-to-source line end orientation and a source line end-to-bit line end orientation. So instead for this string, the corresponding string select transistor is connected to the other end of the string. The NAND string with memory cells 73, 74 also has a string select device, not shown, on the other end of the string. The trace 88 is terminated by a source line 107 in the source line structures.

Ground select transistors 90-95 are arranged at the first ends of the NAND strings. Ground select transistors 72, 75, 78 and corresponding second plane ground select transistors are arranged at the second ends of the NAND strings. Accordingly, ground select transistors are on both ends of the memory strings. Depending on the particular end of the memory string, the ground select transistor couples the memory string to a source line, or to a string select device and bit line.

The ground select signal GSL 159 in this example is coupled to the gates of the ground select transistors 90-95, and can be implemented in the same manner as the word lines 160, 161. The string select transistors and ground select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors.

Figure 6:
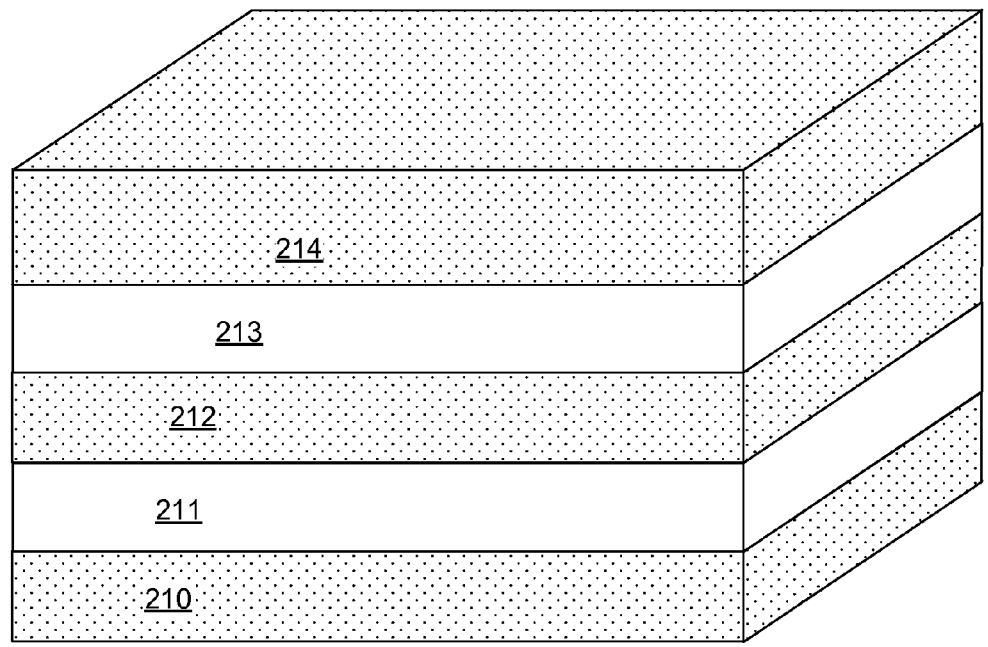
FIG. 6 illustrates a first stage in a process for manufacturing a memory device like that of FIG. 1.

FIGS. 6-10 illustrate stages in a basic process flow for implementing 3D memory arrays as described above utilizing only 2 pattern masking steps that are critical alignment steps for array formation. In FIG. 6, a structure is shown which results from alternating deposition of insulating layers 210, 212, 214 and semiconductor layers 211, 213 formed using doped semiconductors for example in a blanket deposition in the array area of a chip. Depending on the implementation, the semiconductor layers 211, 213 can be implemented using polysilicon or epitaxial single crystal silicon. Inter-level insulating layers 210, 212, 214 can be implemented for example using silicon dioxide, other silicon oxides, or silicon nitride. These layers can be formed in a variety of ways, including low pressure chemical vapor deposition LPCVD processes available in the art.

Figure 7:
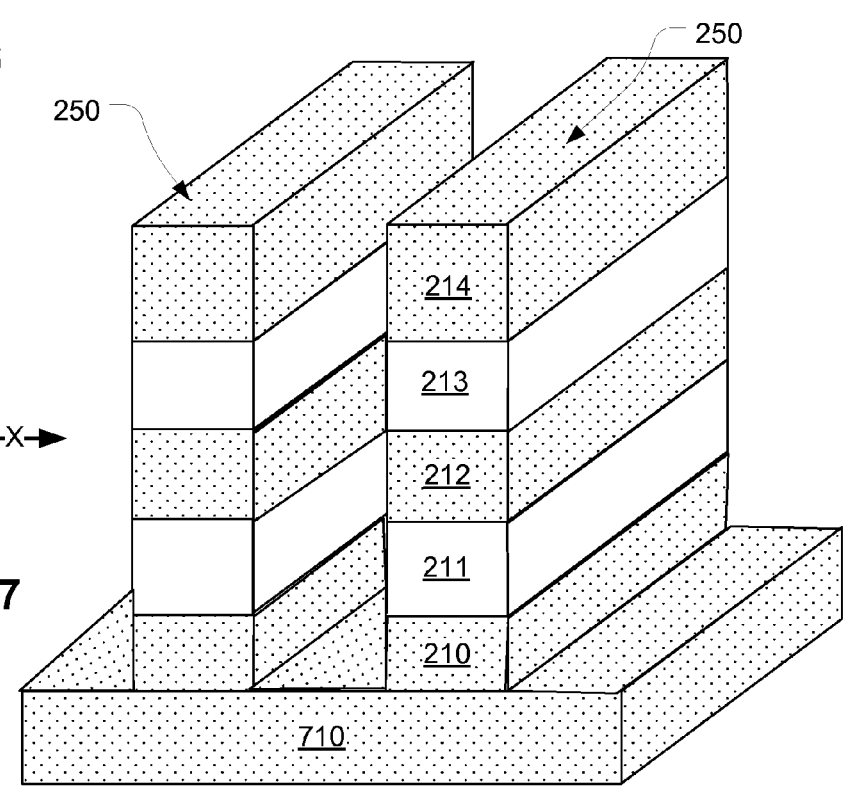
FIG. 7 illustrates a second stage in a process for manufacturing a memory device like that of FIG. 1.

FIG. 7 shows the result of a first lithographic patterning step used to define a plurality of ridge-shaped stacks 250 of semiconductor bit line strips, where the semiconductor bit line strips are implemented using the material of the semiconductor layers 211, 213, and separated by the insulating layers 210, 212, 214. Deep, high aspect ratio trenches can be formed in the stack, supporting many layers, using lithography based processes applying a carbon hard mask and reactive ion etching. The plurality of ridge-shaped stacks 250 of semiconductor bit line strips are formed on an integrated circuit substrate having an insulating layer 710 over underlying semiconductor or other structures (not shown). This patterning step can establish a minimum critical dimension for the widths of the semiconductor bit line strips as discussed above, because of practical limitations on the achievable aspect ratio.

Figure 8:
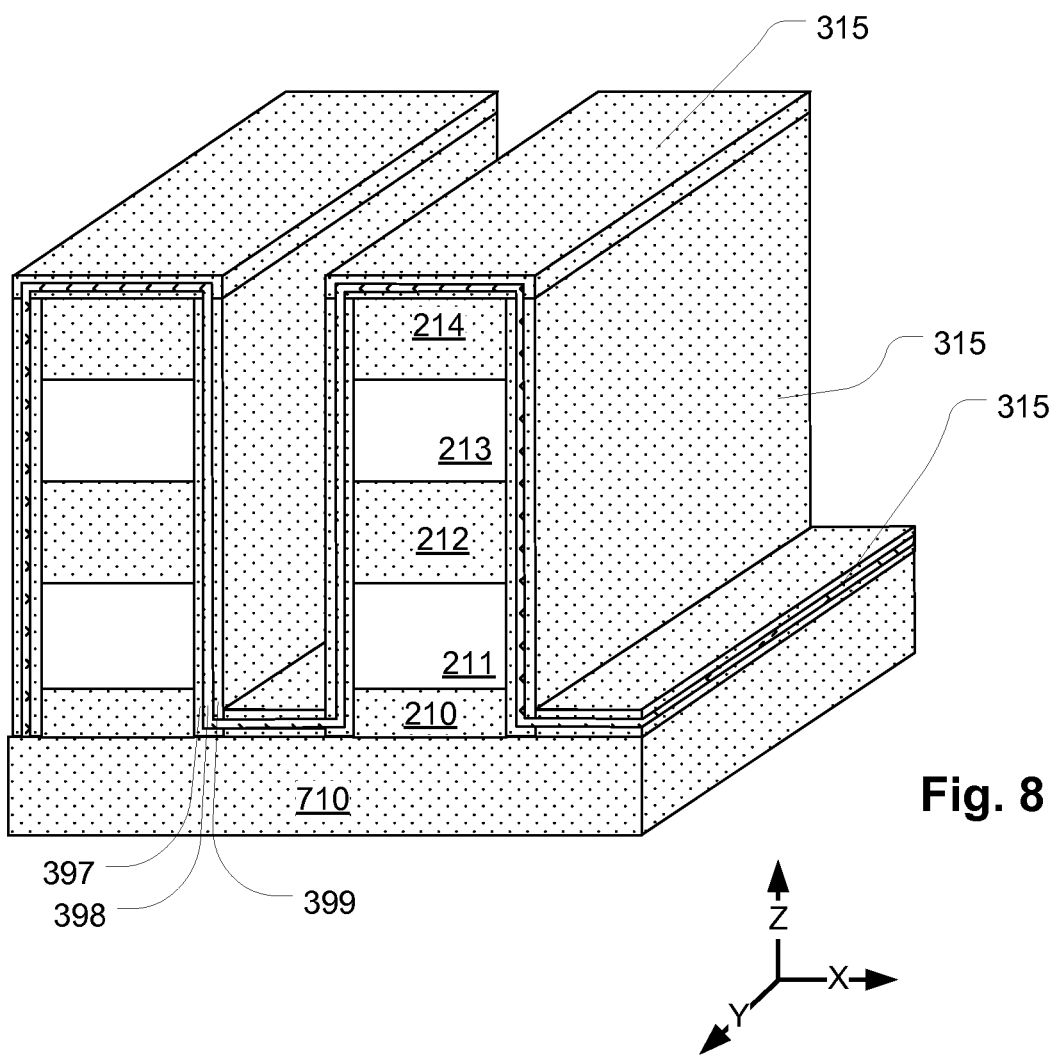
FIG. 8 illustrates a third stage in a process for manufacturing a memory device like that of FIG. 1.

Although not shown, at this step the alternating orientations of the memory strings are defined: the bit line end-to-source line end orientation, and the source line end-to-bit line end orientation FIG. 8 shows the next stage for an embodiment including a programmable charge trapping memory structure such as a BE-SONOS type memory cell structure. FIG. 8 shows results of blanket deposition of a layer 315 that comprises a multilayer charge trapping structure including a tunneling layer 397, a dielectric charge trapping layer 398 and a blocking layer 399 as described above in connection with FIG. 1. As shown in FIG. 8, the memory layer 315 is deposited in a conformal manner over the ridge-shaped stacks (250 of FIG. 7) of semiconductor bit line strips.

Figure 9:
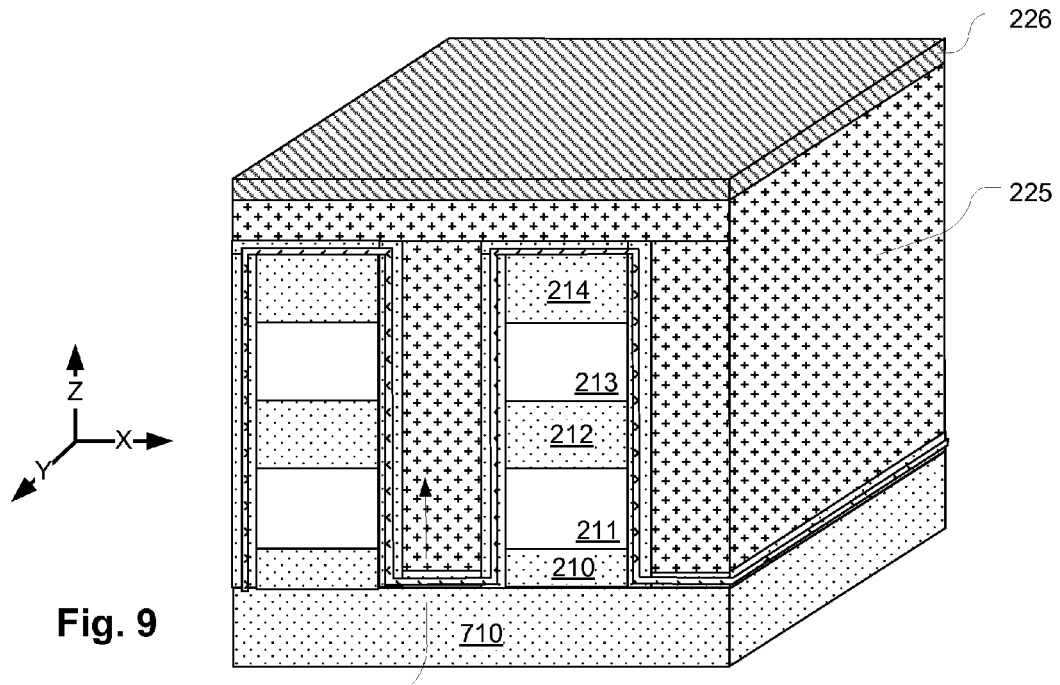
FIG. 9 illustrates a third stage in a process for manufacturing a memory device like that of FIG. 1.

FIG. 9 shows the results of a high aspect ratio fill step in which conductive material, such as polysilicon having n-type or p-type doping, metal, and combinations of conductive materials chosen for work function, conductivity and manufacturability, to be used for the word lines, is deposited to form layer 225. Also, a layer of silicide 226 can be formed over the layer 225 in embodiments in which polysilicon is utilized. As illustrated in the figure, high aspect ratio deposition technologies such as low-pressure chemical vapor deposition of polysilicon in the illustrated embodiments is utilized to completely fill the trenches 220 between the ridge-shaped stacks, even very narrow trenches on the order of 10 nanometers wide with high aspect ratio.

Figure 10:
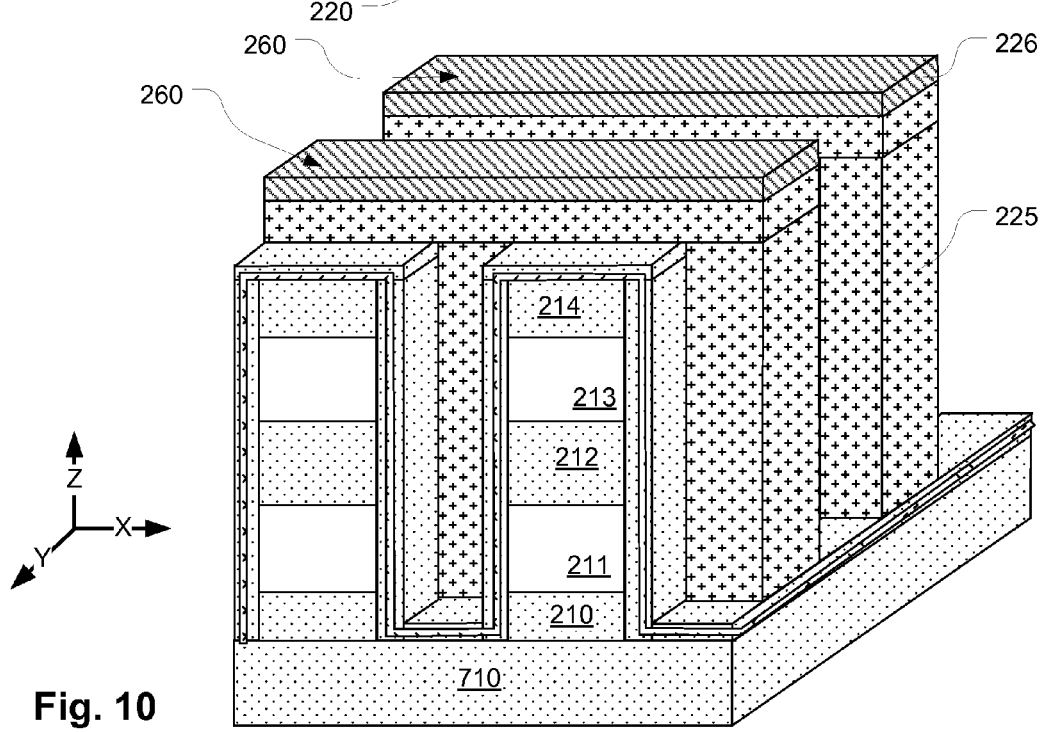
FIG. 10 illustrates a fourth stage in a process for manufacturing a memory device like that of FIG. 1, followed by further stages of a hard mask and an optional implant step.

FIG. 10 shows results of the second lithographic patterning step used to define a plurality of word lines 260 which act as word lines for the 3D memory array. The second lithographic patterning step utilizes a single mask for critical dimensions of the array for etching high aspect ratio trenches between the word lines, without etching through the ridge-shaped stacks. Polysilicon can be etched using an etch process that is highly selective for polysilicon over silicon oxides or silicon nitrides. Thus, alternating etch processes are used, relying on the same mask to etch through the conductor and insulating layers, with the process stopping on the underlying insulating layer 710 in the integrated circuit substrate.

At this step, the ground select lines can also be defined. At this step, the gate structures which are controlled by string select lines can also be defined, although the gate structures are conformal to individual semiconductor strip stacks.

An optional manufacturing step includes forming hard masks over the plurality of word lines, and hard masks over the gate structures. The hard masks can be formed using a relatively thick layer of silicon nitride or other material which can block ion implantation processes. After the hard masks are formed, an implant can be applied to increase the doping concentration in the semiconductor bit line strips, and in stairstep structures, and thereby reduce the resistance of the current path along the semiconductor bit line strips. By utilizing controlled implant energies, the implants can be caused to penetrate to the bottom semiconductor strip, and each overlying semiconductor strip in the stacks.

Subsequently, the hard masks are removed, exposing the silicide layers along the top surfaces of the word lines, and over the gate structures. After an interlayer dielectric is formed over the top of the array, vias are opened in which contact plugs, using tungsten fill for example, are formed reaching to the top surfaces of the gate structures. Overlying metal lines are patterned to connect as SSL lines, to column decoder circuits. A three-plane decoding network is established, accessing a selected cell using one word line, one bit line and one SSL line. See, U.S. Pat. No. 6,906,940, entitled Plane Decoding Method and Device for Three Dimensional Memories.

This second patterning step can establish second critical dimensions for the memory cells that impact the effective channel length of the cells, as discussed above.

Figure 11:
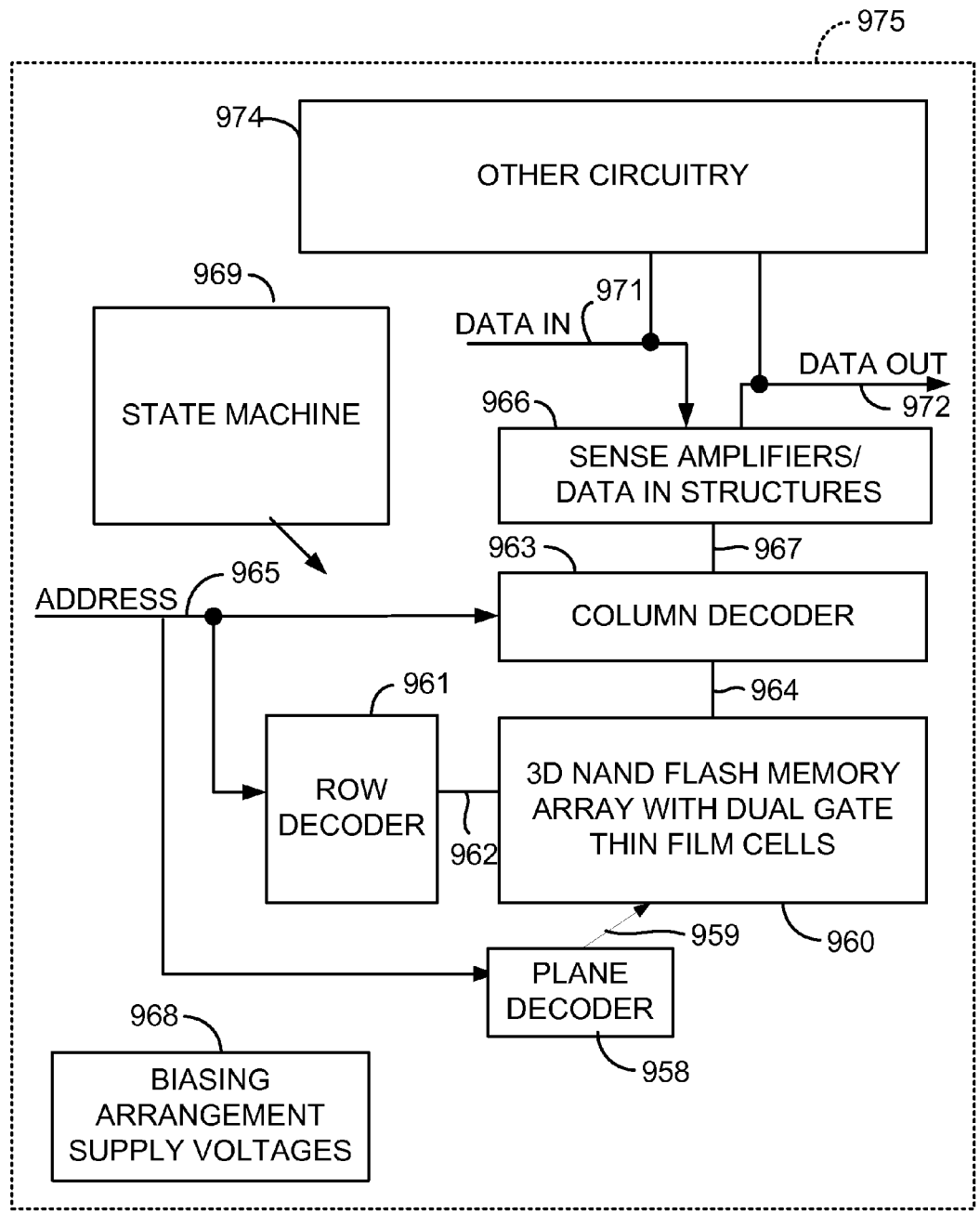
FIG. 11 is a schematic diagram of an integrated circuit including a 3D NAND-flash memory array with row, column and plane decoding circuitry.

FIG. 11 is a simplified block diagram of an integrated circuit according to an embodiment of the present invention. The integrated circuit 975 includes a 3D NAND flash memory array 960, implemented as described herein, on a semiconductor substrate with alternating memory string orientations of bit line end-to-source line end orientation and source line end-to-bit line end orientation, and at either end of the stacks with the string select line gate structure on every other stack. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

In a read bias operation, the controller implemented in this example using bias arrangement state machine 968 can provide a read bias voltage to a memory cell to induce a read current for sensing by sense amplifiers in the block 966. As illustrated in FIG. 2, each memory cell is a double gate field effect transistor. The memory cell stores electrical charge in a layer of memory material, such as dielectric charge storage structures (e.g. 115), between a semiconductor material strip (e.g. 114) acting as a channel and a word line (e.g. 116) acting as gates of the double gate field effect transistor. The amount of charge stored affects the threshold voltage of the memory cell or the transistor, which can be sensed to indicate data. The memory cell can have a low threshold state and a high threshold state depending on the charge stored to indicate two logic levels. The difference between the two threshold states is a programming window or a sensing margin. In order to reliably distinguish between the two threshold states, it is important to maintain a relatively large sensing margin. In some embodiments, there may be more than two threshold states.

FIGS. 12-19 and 20A-20D illustrate results from simulation of distributions of threshold voltage $V_T$ and sub-threshold slope (SS) in a dual gate memory cell. The distributions may be caused by random grain boundaries and trap locations in the dual gate memory cell. As described herein, the dual gate memory cell has a channel body with opposing first and second side surfaces, charge storage structures on the first and second side surfaces, and a gate structure overlying the charge storage structures on the first and second side surfaces. The channel body has a channel depth between the first and second side surfaces. The gate structure has a width which establishes a channel length in the channel body regions along the first and second side surfaces. The simulation uses various channel lengths or word line critical dimensions (WL CD), and various channel body depths, set by bit line critical dimensions (BL CD). The simulation is performed using TCAD, a simulation tool provided by Synopsys, Inc., that supports simulation of random grain boundaries and trap locations in memory cells.

In FIGS. 13, 15, 17, and 19, the sub-threshold slope (SS) is a slope of gate voltage versus logarithmic drain current (sub-threshold leakage current). The unit of sub-threshold slope (SS) is milliVolts/dec, where a dec (decade) corresponds to a 10 times increase of the sub-threshold leakage current. Steeper sub-threshold slopes are "better" because they correspond to lower power consumption, faster transitions between off and on states, and higher reliability.

Wider distributions of memory cell characteristics including $V_T$ and SS can lead to more conservative design of memory devices in order to tolerate the worst case $V_T$ and the worst case SS. Accordingly, tighter distributions of $V_T$ and SS correspond to more consistent and predictable threshold voltage and sub-threshold current leakage, and lead to higher performance and more reliable memory devices.

Figure 20A:
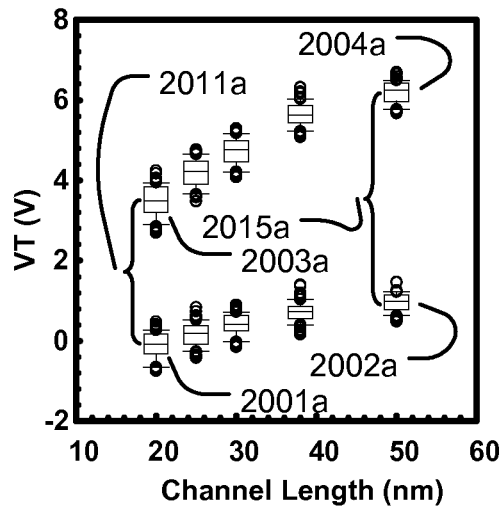
FIGS. 20A-20D illustrate results from simulation of programming windows in a dual gate memory cell.
Figure 20B:
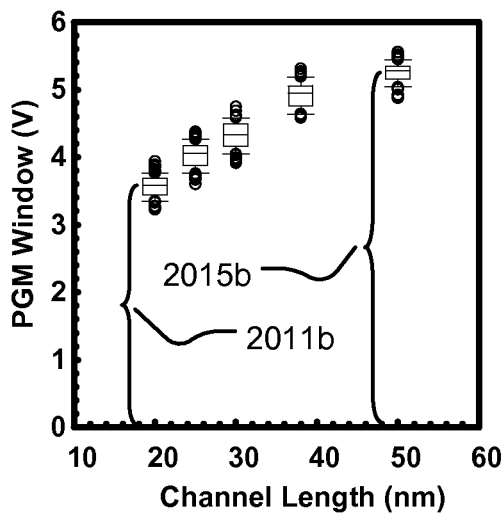

Threshold voltage $V_T$ roll-off refers to the phenomenon that as channel lengths decrease, threshold voltage $V_T$ decreases. $V_T$ roll-off is further described in connection with FIGS. 12 and 14. $V_T$ roll-off can lead to programming window roll-off or narrower programming windows. Programming windows are margins between the $V_T$ distributions for the programmed state (high threshold state) and the $V_T$ distributions for the fresh state (low threshold state). Programming window roll-off is further described in connection with FIGS. 20A and 20B. Either the $V_T$ roll-off or the programming window roll-off may lead to malfunction of memory cells. FIGS. 13 and 15 illustrate that smaller channel lengths correlate with wider distributions of sub-threshold slope (SS). FIGS. 20A and 20B illustrate that smaller channel lengths correlate with narrower programming windows or margins. Accordingly, wider distributions of sub-threshold slope (SS) correlate with narrower programming windows or margins.

Figure 12:
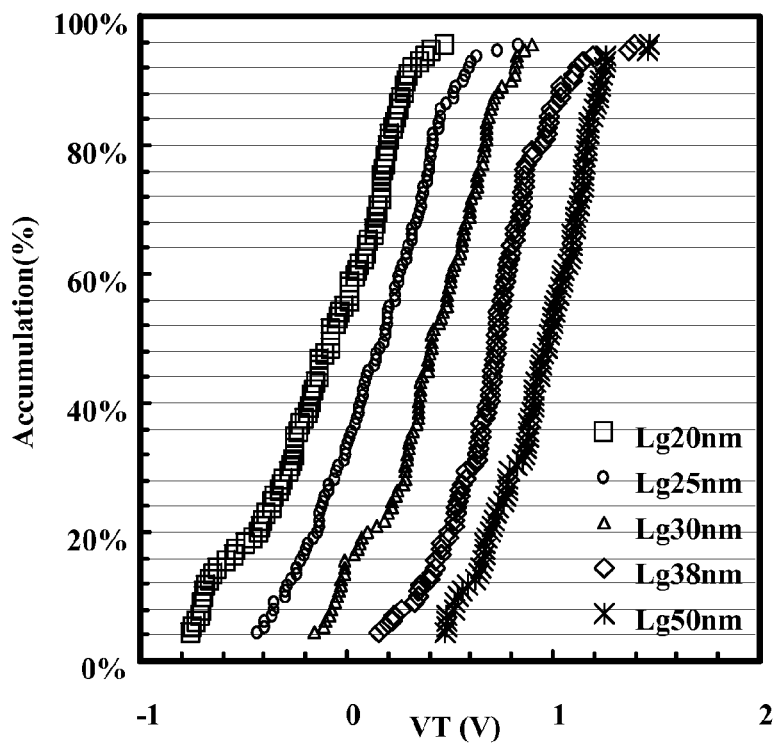
FIGS. 12-19 illustrate results from simulation of distributions of threshold voltage and sub-threshold slope in a dual gate memory cell.
Figure 13:
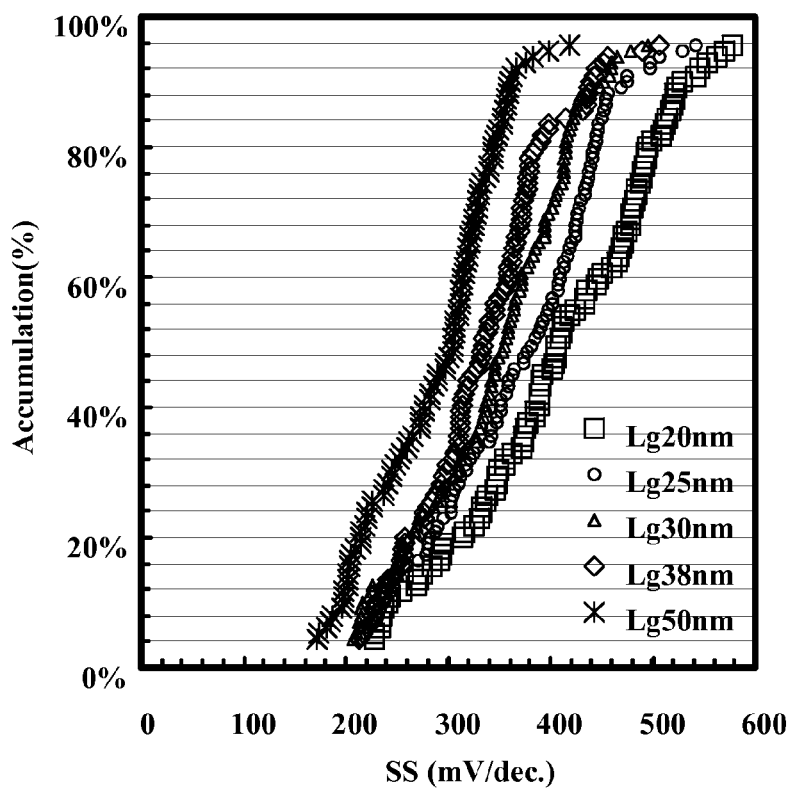

FIG. 12 illustrates results from simulation of threshold voltage (Vt) distributions in the dual gate memory cell with various channel lengths or word line critical dimensions (WL CD) at fixed word line (WL) half pitch of 38 nanometers (nm). Channel lengths or word line critical dimensions used in the simulation include channel lengths (Lg) of 20 nm, 25 nm, 30 nm, 38 nm, and 50 nm. The results illustrated in FIG. 12 are for the "fresh state," or the initial $V_T$ distribution before programming of memory cells. The results show that WL CD or channel lengths (Lg) greater than a threshold length of 38 nanometers correspond to tighter Vt distributions, for example, between 0.4V and 1.4V for Lg of 50 nm. Conversely, shorter WL CD or channel length (Lg) causes $V_T$ roll-off and wider $V_T$ distributions. For instance, $V_T$ distribution for Lg of 20 nm is between −0.8V and 0.4V, as opposed to between 0.4V and 1.4V for Lg of 50 nm. Threshold voltage $V_T$ roll-off refers to the phenomenon that as channel lengths decrease, threshold voltage $V_T$ decreases. The results seen at threshold length of 38 nanometers used in the simulations suggest a critical threshold of about 38 nm, where the term about variations on the order of +/−2 nm, or between 36 nm and 40 nm that arise due to limitations in the simulation accuracy, the granularity of the measurement used in the simulations, and other variations in cell structures.

FIG. 13 illustrates results from simulation of sub-threshold slope (SS) distributions in the dual gate memory cell under the same conditions as described for FIG. 12. The results show that WL CD or channel lengths (Lg) greater than a threshold length of 40 nanometers correspond to lower (better) SS and a tighter distribution of SS, for example, between 170 mV/dec and 420 mV/dec for Lg of 50 nm. Conversely, shorter WL CD or channel lengths (Lg) correspond to higher (worse) SS and a wider distribution of SS. For instance, Lg of 20 nm corresponds to SS between 200 mV/dec and 580 mV/dec, as opposed to 170 mV/dec and 420 mV/dec for Lg of 50 nm. As described herein, tighter distributions of sub-threshold slopes correspond to more consistent and predictable sub-threshold current leakage, and lead to higher performance and more reliable memory devices.

Figure 14:
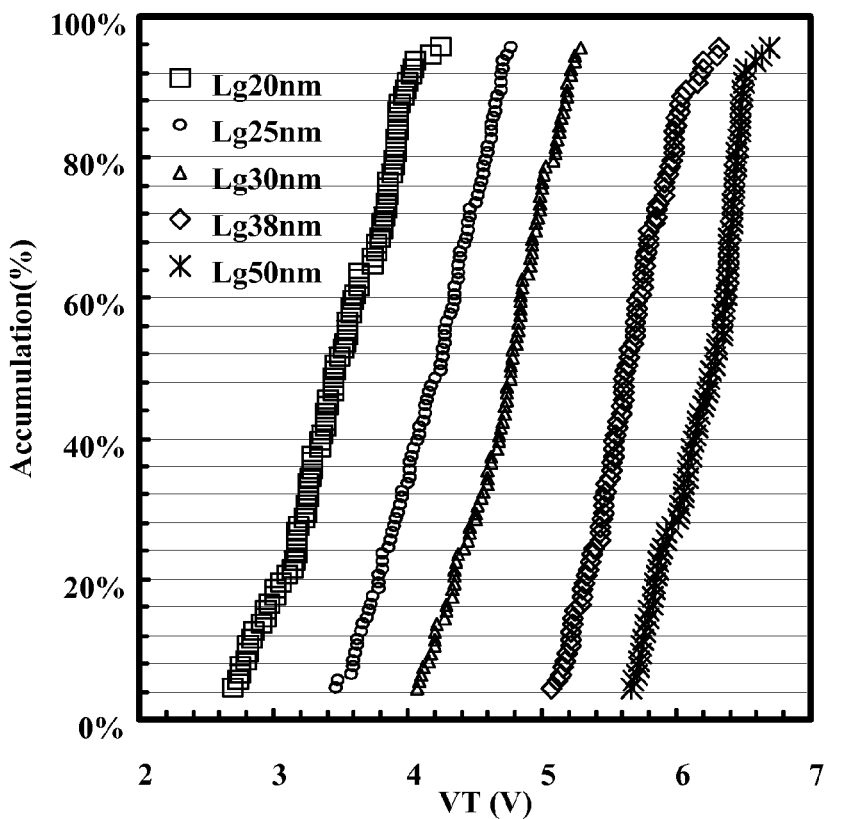
Figure 15:
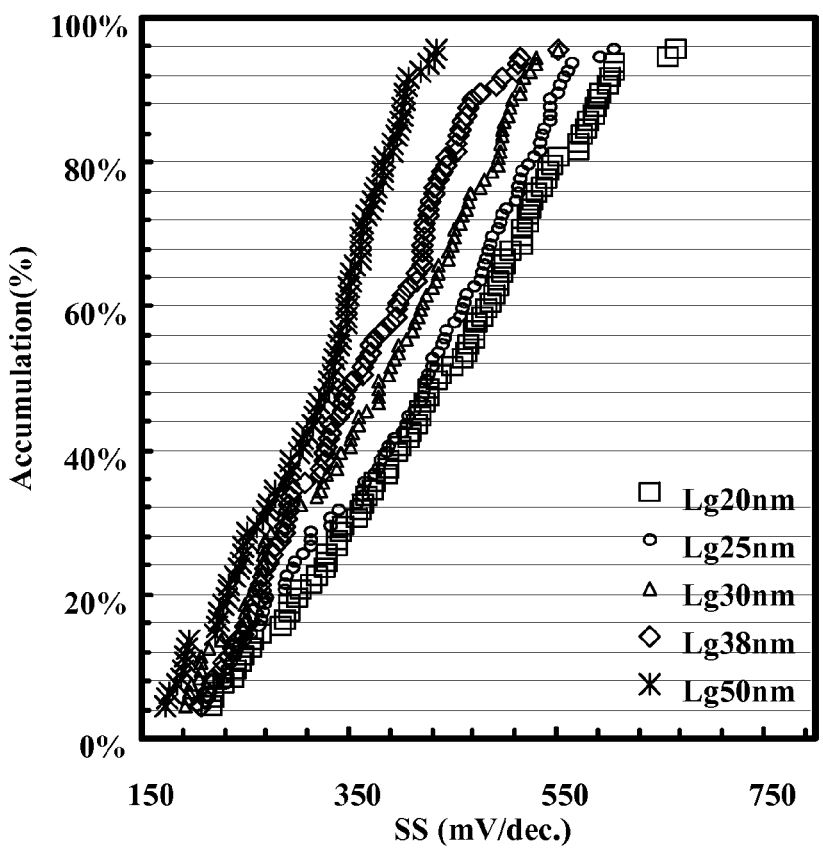

FIG. 14 illustrates results from simulation of threshold voltage $V_T$ distributions in the dual gate memory cell with various channel lengths or word line critical dimensions (WL CD) at fixed word line (WL) half pitch of 38 nm. Conditions for results shown in FIG. 14 are generally the same as for FIG. 12. The difference in FIG. 14 is that the device is in a "programmed state" or a high threshold state after programming of memory cells, instead of the "fresh state" or a low threshold state as in FIG. 12. The results show that WL CD or channel lengths (Lg) greater than a threshold length of 38 nanometers correspond to tighter $V_T$ distributions, for example, between 5.6V and 6.8V for Lg of 50 nm. Conversely, shorter WL CD or channel length (Lg) causes $V_T$ roll-off and wider $V_T$ distributions. For instance, $V_T$ distribution for Lg of 20 nm is between 2.6V and 4.2V, as opposed to between 5.6V and 6.8V for Lg of 50 nm.

FIG. 15 illustrates results from simulation of sub-threshold slope (SS) distributions in the dual gate memory cell under generally the same conditions as described for FIG. 13. The difference in FIG. 15 is that the device is in a "programmed state" or a high threshold state after programming of memory cells, instead of the "fresh state" or a low threshold state as in FIG. 13. The results show that WL CD or channel lengths (Lg) greater than a threshold length of 40 nanometers correspond to lower (better) SS and a tighter distribution of SS, for example, between 170 mV/dec and 430 mV/dec for Lg of 50 nm. Conversely, shorter WL CD or channel lengths (Lg) correspond to higher (worse) SS and a wider distribution of SS. For instance, Lg of 20 nm corresponds to SS between 170 mV/dec and 670 mV/dec, as opposed to 170 mV/dec and 430 mV/dec for Lg of 50 nm. As described herein, tighter distributions of sub-threshold slopes correspond to more consistent and predictable sub-threshold current leakage, and lead to higher performance and more reliable memory devices.

FIGS. 12-15 demonstrate benefits provided by WL CD or channel lengths (Lg) greater than a threshold length where for both fresh and programmed (low threshold and high threshold) states, severity of $V_T$ roll-off is reduced and tighter distributions of $V_T$ and SS are achieved. Since $V_T$ roll-off can lead to programming window roll-off, when severity of $V_T$ roll-off is reduced, potential for programming window roll-off is also reduced. Programming window roll-off is further described in connection with FIGS. 20A and 20B. As described herein, wider distributions of memory cell characteristics including $V_T$ and SS can lead to more conservative design of memory devices in order to tolerate the worst case $V_T$ and the worst case SS. Accordingly, tighter distributions of $V_T$ and SS correspond to more consistent and predictable threshold voltage and sub-threshold current leakage, and can lead to higher performance and more reliable memory devices.

Figure 16:
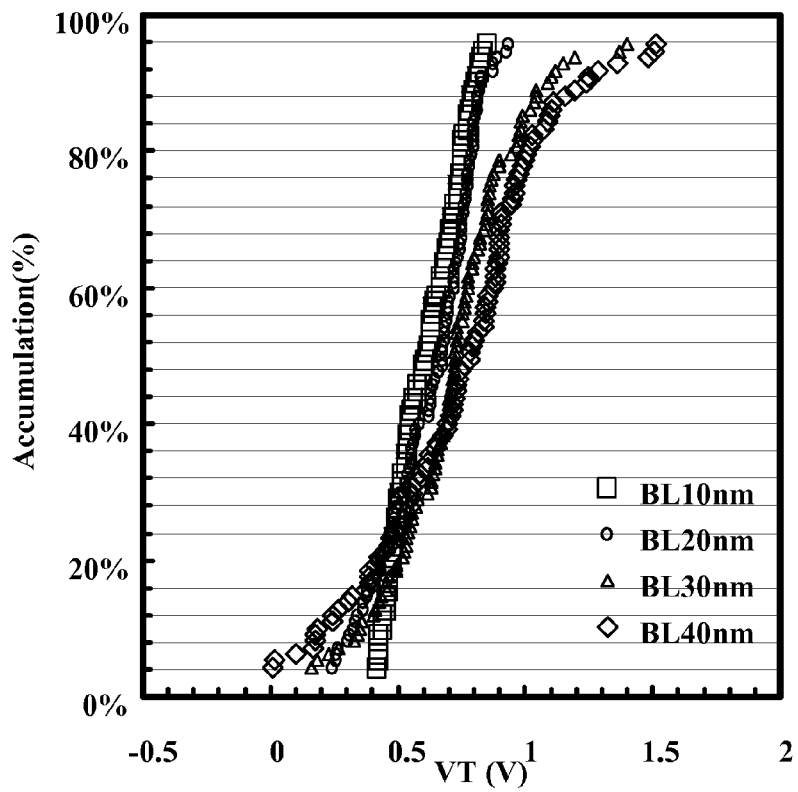

FIG. 16 illustrates results from simulation of threshold voltage $V_T$ distributions in the dual gate memory cell with various channel body depths, set by bit line critical dimensions (BL). Channel body depths used in the simulation include 10 nm, 20 nm, 30 nm, and 40 nm. The results illustrated in FIG. 12 are for the "fresh state," or the initial $V_T$ distribution before programming of memory cells. The results show that channel body depths less than a threshold thickness of 20 nanometers correspond to tighter $V_T$ distributions, for example, between 0.4V and 0.8V for BL of 10 nm. Conversely, larger channel body depths correspond to wider Vt distributions. For instance, $V_T$ distribution for BL of 40 nm is between 0V and 1.5V, as opposed to between 0.4V and 0.8V for BL of 10 nm. The results seen at threshold body depth of 20 nanometers used in the simulations suggest a critical threshold of about 20 nm, where the term about variations on the order of +/−2 nm, or between 18 nm and 22 nm that arise due to limitations in the simulation accuracy, the granularity of the measurement used in the simulations, and other variations in cell structures.

Figure 17:
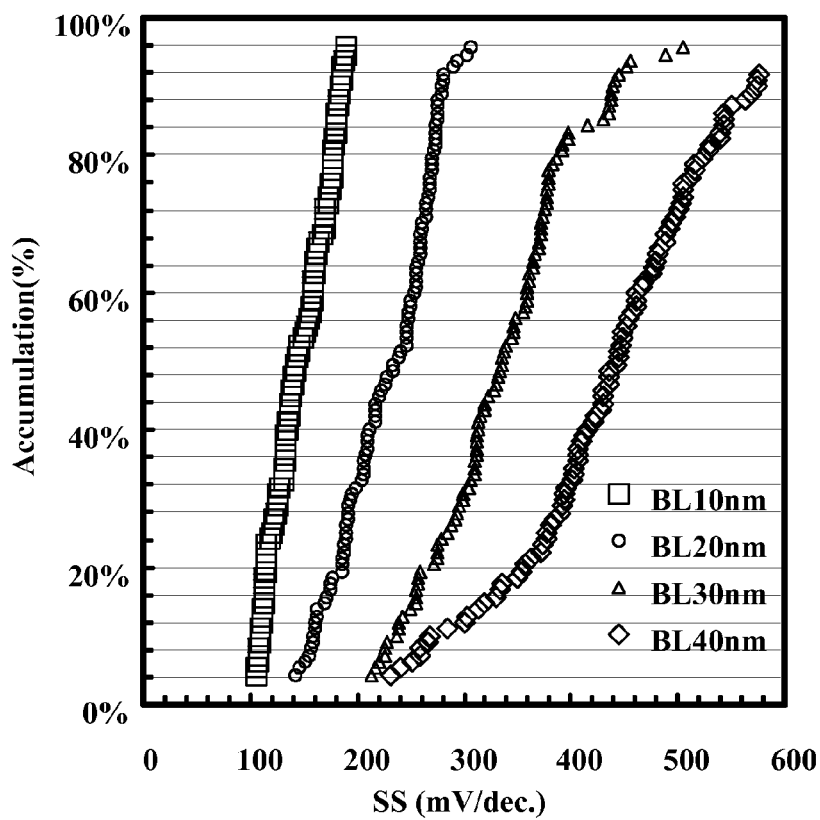

FIG. 17 illustrates results from simulation of sub-threshold slope (SS) distributions in the dual gate memory cell under the same conditions as described for FIG. 16. The results show that channel body depths, set by bit line critical dimensions (BL) less than a threshold thickness of 20 nanometers correspond to lower (better) SS and a tighter distribution of SS, for example, between 100 mV/dec and 180 mV/dec for BL of 10 nm. Conversely, larger bit line critical dimensions (BL) correspond to higher (worse) SS and a wider distribution of SS. For instance, BL of 40 nm corresponds to SS between 220 mV/dec and 580 mV/dec, as opposed to 100 mV/dec and 180 mV/dec for BL of 10 nm.

Figure 18:
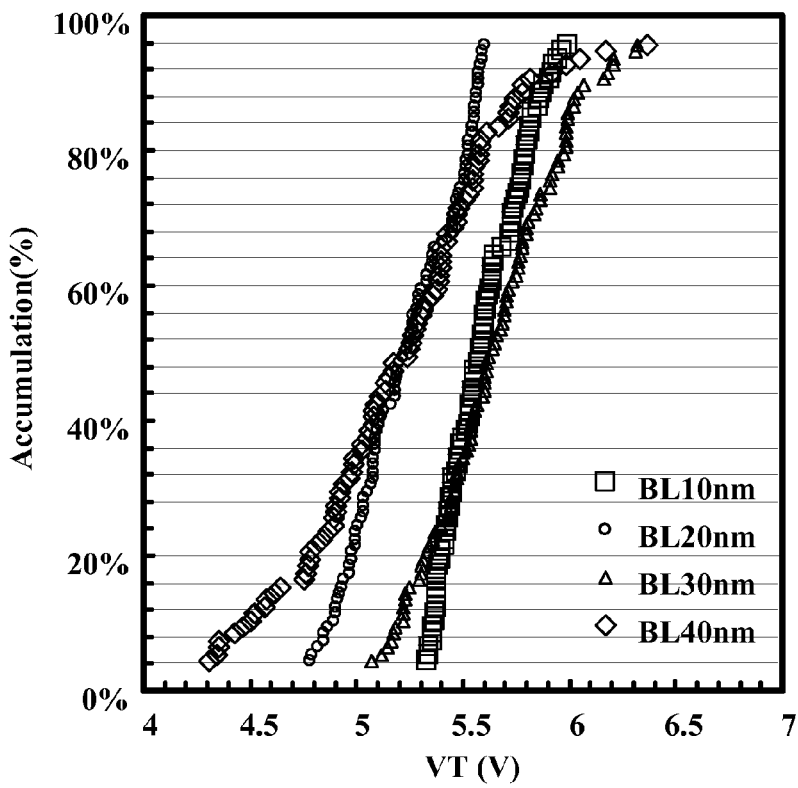

FIG. 18 illustrates results from simulation of threshold voltage $V_T$ distributions in the dual gate memory cell with various channel body depths, set by bit line critical dimensions (BL). Conditions for results shown in FIG. 18 are generally the same as for FIG. 16. The difference in FIG. 16 is that the device is in a "programmed state" or a high threshold state, instead of a "fresh state" or a low threshold state. The results show that bit line critical dimensions (BL) less than a threshold thickness of 20 nanometers correspond to tighter $V_T$ distributions, for example, between 5.3V and 6V for BL of 10 nm. Conversely, larger bit line critical dimensions (BL) correspond to wider $V_T$ distributions. For instance, $V_T$ distribution for BL of 40 nm is between 4.3V and 6.4V, as opposed to between 5.3V and 6V for BL of 10 nm.

Figure 19:
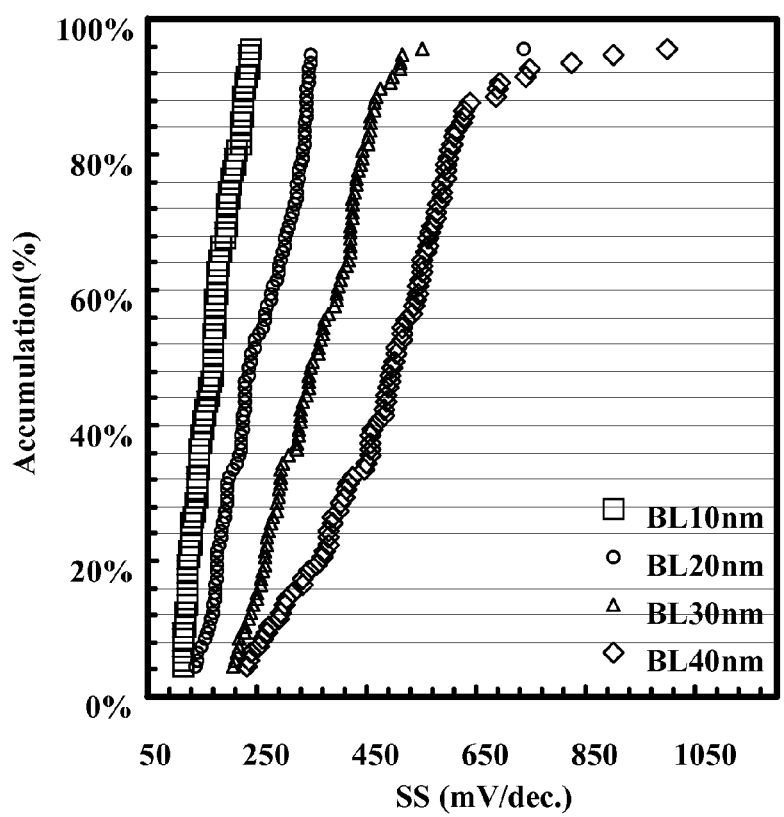

FIG. 19 illustrates results from simulation of sub-threshold slope (SS) distributions in the dual gate memory cell under the same conditions as described for FIG. 18. The results show that channel body depths, set by bit line critical dimensions (BL) less than a threshold thickness correspond to lower (better) SS and a tighter distribution of SS, for example, between 75 mV/dec and 225 mV/dec for BL of 10 nm. Conversely, larger bit line critical dimensions (BL) correspond to higher (worse) SS and a wider distribution of SS. For instance, BL of 40 nm corresponds to SS between 225 mV/dec and 975 mV/dec, as opposed to 75 mV/dec and 225 mV/dec for BL of 10 nm.

FIGS. 16-19 demonstrate benefits provided by channel body depths, set by bit line critical dimensions (BL), less than a threshold thickness of about 30 nanometers, where for both fresh and programmed (low threshold and high threshold) states, tighter $V_T$ distributions, tighter SS distributions, and lower SS are achieved. As described herein, wider distributions of memory cell characteristics including $V_T$ and SS can lead to more conservative design of memory devices in order to tolerate the worst case $V_T$ and the worst case SS. Accordingly, tighter distributions of $V_T$ and SS correspond to more consistent and predictable threshold voltage and sub-threshold current leakage, and can lead to higher performance and more reliable memory devices. Lower SS corresponds to lower power consumption in memory cells.

FIGS. 20A-20D illustrate results from simulation of programming windows in the dual gate memory cell. The results are based on threshold voltage $V_T$ distributions in fresh and programmed states, or low and high threshold states respectively, at various channel lengths or word line effective critical dimensions (WL ECD) and various channel body depths set by bit line effective critical dimensions (BL ECD) as illustrated in FIGS. 12-19.

FIG. 20A illustrates $V_T$ distributions for word line effective critical dimensions (WL ECD) at channel lengths of 20 nm, 25 nm, 30 nm, 38 nm, and 50 nm for the fresh state and programmed state. For instance, in the fresh state, $V_T$ distribution 2001a for channel length of 20 nm is between −0.8V and 0.4V, while $V_T$ distribution 2002a for channel length of 50 nm is between 0.4V and 1.4V. In the programmed state, $V_T$ distribution 2003a for channel length of 20 nm is between 2.6V and 4.2V, while $V_T$ distribution 2004a for channel length of 50 nm is between 5.6V and 6.8V. Simulation results for the fresh state used in FIG. 20A are based on the simulation results used in FIG. 12. Simulation results for the programmed state used in FIG. 20A are based on the simulation results used in FIG. 14.

Threshold voltage $V_T$ roll-off refers to the phenomenon that as channel lengths decrease, threshold voltage $V_T$ decreases. As illustrated in FIG. 20A, in the programmed state or the high threshold state, $V_T$ decreases from the $V_T$ distribution 2004a for channel length of 50 nm between 5.6V and 6.8V to the $V_T$ distribution 2003a for channel length of 20 nm between 2.6V and 4.2V. In the fresh state or the low threshold state, $V_T$ decreases from the $V_T$ distribution 2002a for channel length of 50 nm between 0.4V and 1.4V to the $V_T$ distribution 2001a for channel length of 20 nm between −0.8V and 0.4V. Thus, $V_T$ roll-off is more severe in the programmed state than in the fresh state.

Consequently, channel lengths or word line critical dimensions (WL CD) have effects on programming windows or margins between the $V_T$ distributions for the programmed state and the $V_T$ distributions for the fresh state. As channel lengths or word line critical dimensions (WL CD) increase, programming windows or margins are improved. For instance, at channel length of about 20 nm, an average value for the $V_T$ distribution for the programmed state is about 3.5V, while an average value for the $V_T$ distribution for the fresh state is about −0.1V. Therefore an average programming window or margin at channel length of about 20 nm is about 3.5V minus −0.1V or 3.6V. At channel length of 50 nm, an average value for the $V_T$ distribution for the programmed state is about 6.2V, while an average value for the $V_T$ distribution for the fresh state is about 1.0V. Therefore an average programming window or margin at channel length of 50 nm is improved to about 6.2V minus 1.0V or 5.2V (2015a), from about 3.6V (2011a) for channel length of 20 nm. Improved programming windows or margins can more reliably distinguish between high and low threshold states of memory cells.

A scaling limitation because of the short channel effect in Double Gate MOSFET can be understood by the function defining the gate length of the call, as follows:

$$Lg >= 1.5\lambda,$$
$$\lambda = 2ti + \frac{\varepsilon_{Si}}{\varepsilon_i} t_{Si},$$

where ti is EOT of the charge storage structure, and $t_{si}$ is semiconductor bit line width. Therefore, ONO of the charge storage structure should be lower than the width of the vertical gate structures that defines gate length Lg for the cells.

FIG. 20B illustrates programming (PGM) windows between the Vt distributions for the programmed state and the $V_T$ distributions for the fresh state as illustrated in FIG. 20A. FIG. 20B illustrates that channel lengths greater than a threshold length of about 38 nanometers correspond to larger programming windows or margins. For instance, the programming window at channel length of 50 nm is improved to about 5.2V (2015b) from about 3.6V (2011b) for channel length of 20 nm. Conversely, shorter channel lengths correspond to smaller programming windows, or cause "programming window roll-off".

Figure 20C:
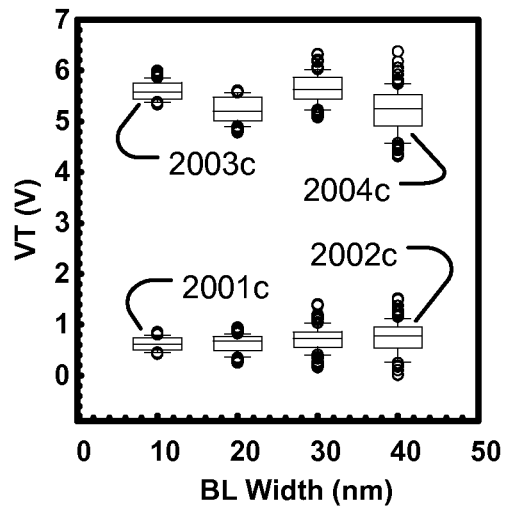

FIG. 20C illustrates $V_T$ distributions for bit line effective critical dimensions (BL ECD) used in the simulation at bit line (BL) widths of 10 nm, 20 nm, 30 nm, and 40 nm for the fresh state and programmed (PGM) state. For instance, in the fresh state, $V_T$ distribution 2001c for BL width of 10 nm is between 0.4V and 0.8V, while $V_T$ distribution 2002c for BL width of 40 nm is between 0V and 1.5V. In the programmed state, $V_T$ distribution 2003c for BL width of 10 nm is between 5.3V and 6V, while $V_T$ distribution 2004c for BL width of 40 nm is between 4.3V and 6.4V. Simulation results for the fresh state used in FIG. 20C are based on the simulation results used in FIG. 16. Simulation results for the programmed state used in FIG. 20C are based on the simulation results used in FIG. 18.

Figure 20D:
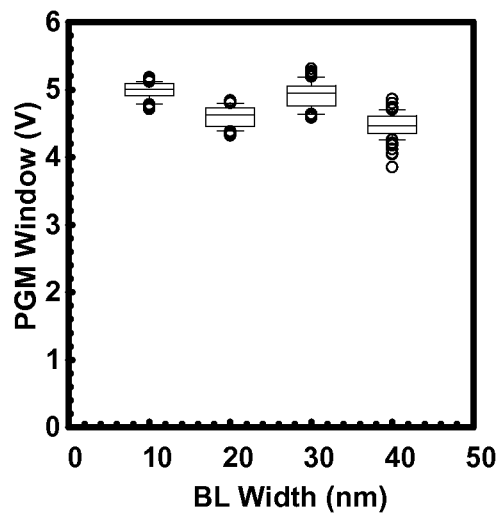

FIG. 20D illustrates programming (PGM) windows between the $V_T$ distributions for the programmed state and the $V_T$ distributions for the fresh state as illustrated in FIG. 20C. FIG. 20D illustrates that BL widths less than a threshold thickness of 20 nanometers correspond to tighter $V_T$ distributions, and to wider programming windows. Conversely, larger BL widths correspond to wider $V_T$ distributions, and to smaller programming windows. For instance, at BL width of 40 nm, the programming window is less than 3.9V, while at BL width of 20 nm, the programming window is less than 4.3V. For instance, at BL width of 40 nm, the $V_T$ distributions is between 3.9V and 4.9V, while at BL width of 20 nm, the $V_T$ distributions is between 4.3V and 4.8V. As described herein, tighter $V_T$ distributions correspond to more consistent and predictable threshold voltage, and improved programming windows or sensing margins can more reliably distinguish between high and low threshold states of memory cells.

In the example shown in FIGS. 20A-20D, a relatively large programming window or sensing margin of about 4V centered around a read voltage less than 4 Volts, corresponds to a channel body having a combination of a channel body length greater than about 38 nanometers and a channel body depth (BL width) less than about 20 nanometers. The read voltage less than 4 Volts is applied to the word line or gate during a read operation, where the 4 Volts is measured relative to a reference voltage such as ground applied for example to a common source line coupled to the memory cell during a read bias for the cell.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
a dual gate memory cell having a channel body with opposing first and second side surfaces, charge storage structures on the first and second side surfaces, and a gate structure overlying the charge structures on the first and second side surfaces, the channel body having a depth between the first and second side surfaces so that a channel body depth of the memory cell is less than a threshold channel body depth for fully depleted operation when the memory cell has a high threshold state under a read bias, and the gate structure having a width along the first and second side surfaces so that an effective channel length of the cell is greater than a threshold length to suppress sub-threshold leakage current when the memory cell has a high threshold state under the read bias.

2. The device of claim 1, wherein the charge storage structures comprise memory elements that include dielectric charge trapping structures comprising a tunneling layer, a dielectric charge trapping layer and a blocking layer having in combination an equivalent oxide thickness, and where the gate structure width is more than the equivalent oxide thickness of the dielectric charge trapping structures.

3. The device of claim 1 wherein the memory cell comprises a dielectric charge trapping memory cell.

4. The device of claim 1, wherein the threshold channel body depth is between 10 nm and 30 nm, and said threshold length is at least ⅔ the channel body depth.

5. A device, comprising:
a NAND string comprising a channel body with opposing first and second side surfaces, and a plurality of word lines spaced apart and overlying the first and second side surfaces, charge storage structures on the first and second side surfaces between the gate structures and the channel body forming memory cells of the string, the channel body having a depth between the first and second side surfaces so that channel body depths of the memory cells are less than a threshold channel body depth for fully depleted operation when the memory cell has a high threshold state under a read bias, and the word lines having widths along the first and second side surfaces so that effective channel lengths of the cells are greater than a threshold length to suppress sub-threshold leakage current when the corresponding memory cell has a high threshold state under the read bias.

6. The device of claim 5, wherein the charge storage structures comprise dielectric charge trapping structures comprising a tunneling layer, a dielectric charge trapping layer and a blocking layer having in combination an equivalent oxide thickness, and where the gate structure width is more than the equivalent oxide thickness of the dielectric charge trapping structures.

7. The device of claim 5 wherein the memory cell comprises a dielectric charge trapping memory cell.

8. The device of claim 5, wherein said threshold channel body depth is between 10 nm and 30 nm, and said threshold length is at least ⅔ the channel body depth.

* * * * *